(12) United States Patent
Yamazaki

(10) Patent No.: US 9,559,211 B2
(45) Date of Patent: Jan. 31, 2017

(54) SEMICONDUCTOR DEVICE AND MANUFACTURING METHOD THEREOF

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 226 days.

(21) Appl. No.: 13/192,161

(22) Filed: Jul. 27, 2011

(65) Prior Publication Data
US 2012/0025191 A1 Feb. 2, 2012

(30) Foreign Application Priority Data

Jul. 30, 2010 (JP) ................................. 2010-171597

(51) Int. Cl.
*H01L 29/786* (2006.01)
*H01L 21/02* (2006.01)
(Continued)

(52) U.S. Cl.
CPC ....... *H01L 29/7869* (2013.01); *H01L 21/0237* (2013.01); *H01L 21/02554* (2013.01);
(Continued)

(58) Field of Classification Search
CPC ........... H01L 29/42384; H01L 29/7869; H01L 29/76893
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 1669160 A 9/2005
EP 1 737 044 A1 12/2006
(Continued)

OTHER PUBLICATIONS

M.W. Prins et al.; "A ferroelectric transparent thin-film transistor"; Appl. Phys. Lett. (Applied Physics Letters); Jun. 17, 1996; pp. 3650-3652; vol. 68, No. 25.
(Continued)

*Primary Examiner* — Yu Chen
(74) *Attorney, Agent, or Firm* — Fish & Richardson P.C.

(57) ABSTRACT

A method for manufacturing a semiconductor device, which enables miniaturization and reduction of defect, is provided. It includes forming an oxide semiconductor layer, and source and drain electrodes in contact with the oxide semiconductor layer, over an insulating surface; forming insulating layers over the source electrode and the drain electrode; forming a gate insulating layer over the oxide semiconductor layer, the source and drain electrodes, and the insulating layer; forming a conductive layer over the gate insulating layer; forming an insulating film covering the conductive layer; processing the insulating film so that at least part of a region of the conductive layer, which overlaps with the source electrode or the drain electrode, is exposed; and etching the exposed region of the conductive layer to form a gate electrode overlapping with at least part of the region sandwiched between the source electrode and the drain electrode, in a self-aligned manner.

21 Claims, 10 Drawing Sheets

(51) Int. Cl.
  *H01L 29/417* (2006.01)
  *H01L 29/423* (2006.01)
  *H01L 29/66* (2006.01)
(52) U.S. Cl.
  CPC .. *H01L 21/02565* (2013.01); *H01L 21/02631* (2013.01); *H01L 29/41733* (2013.01); *H01L 29/42384* (2013.01); *H01L 29/66969* (2013.01)
(58) Field of Classification Search
  USPC ............................ 257/E21.459, 57; 438/299
  See application file for complete search history.

(56) References Cited

U.S. PATENT DOCUMENTS

| | | | |
|---|---|---|---|
| 6,294,274 B1 | 9/2001 | Kawazoe et al. | |
| 6,495,386 B2* | 12/2002 | Powell | 438/48 |
| 6,563,174 B2 | 5/2003 | Kawasaki et al. | |
| 6,727,522 B1 | 4/2004 | Kawasaki et al. | |
| 6,891,227 B2 | 5/2005 | Appenzeller et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2* | 5/2007 | Shih et al | 257/72 |
| 7,253,065 B2 | 8/2007 | Appenzeller et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,635,856 B2 | 12/2009 | Appenzeller et al. | |
| 7,674,650 B2 | 3/2010 | Akimoto et al. | |
| 7,732,819 B2 | 6/2010 | Akimoto et al. | |
| 7,897,960 B2 | 3/2011 | Appenzeller et al. | |
| 8,441,007 B2 | 5/2013 | Arai | |
| 8,629,434 B2 | 1/2014 | Arai | |
| 9,112,043 B2 | 8/2015 | Arai | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0178617 A1 | 9/2003 | Appenzeller et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0056826 A1 | 3/2005 | Appenzeller et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0017899 A1 | 1/2008 | Appenzeller et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0309092 A1 | 12/2009 | Appenzeller et al. | |
| 2009/0309159 A1 | 12/2009 | Morita et al. | |
| 2009/0315044 A1* | 12/2009 | Amundson et al. | 257/88 |
| 2010/0001260 A1 | 1/2010 | Appenzeller et al. | |
| 2010/0012946 A1* | 1/2010 | Zhi et al. | 257/72 |
| 2010/0051922 A1* | 3/2010 | Hotta et al. | 257/40 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117076 A1* | 5/2010 | Akimoto et al. | 257/43 |
| 2010/0163865 A1 | 7/2010 | Arai | |
| 2011/0042667 A1* | 2/2011 | Kawamura et al. | 257/43 |
| 2011/0089414 A1 | 4/2011 | Yamazaki et al. | |
| 2011/0101331 A1 | 5/2011 | Yamazaki et al. | |

FOREIGN PATENT DOCUMENTS

| | | |
|---|---|---|
| EP | 1 748 503 A2 | 1/2007 |
| EP | 2 226 847 A2 | 9/2010 |
| JP | 60-177676 A | 9/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-225363 A | 9/1989 |
| JP | 02-211635 A | 8/1990 |
| JP | 03-233938 A | 10/1991 |
| JP | 03-266469 A | 11/1991 |
| JP | 05-251705 A | 9/1993 |
| JP | 08-078697 A | 3/1996 |
| JP | 08-264794 A | 10/1996 |
| JP | 11-505377 A | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-508523 A | 3/2006 |
| JP | 2006-165527 A | 6/2006 |
| JP | 2008-211144 A | 9/2008 |
| JP | 2009-231664 A | 10/2009 |
| JP | 2009-302317 A | 12/2009 |
| JP | 2010-141142 A | 6/2010 |
| JP | 2010-170110 A | 8/2010 |
| WO | 03/081687 A2 | 10/2003 |
| WO | 2004/114391 A1 | 12/2004 |

OTHER PUBLICATIONS

Masaki Nakamura et al.; "The Phase Relations in the In2O3—Ga2ZnO4—ZnO System at 1350° C."; Journal of Solid State Chemistry; Aug. 1, 1991; pp. 298-315; vol. 93, No. 2.

Noboru Kimizuka et al.; "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"; Journal of Solid State Chemistry; Apr. 1, 1995; pp. 170-178; vol. 116.

Masaki Nakamura et al.; "Syntheses and crystal structures of new homologous compounds, indium iron zinc oxides (InFeO3(ZnO)m) (m:natural number) and related compounds"; Kotai Butsuri (Solid State Physics); 1993; pp. 317-327; vol. 28, No. 5 {with English translation}.

Kenji Nomura et al.; "Thin-Film Transistor Fabricated in Single-Crystalline Transparent Oxide Semiconductor"; Science; May 23, 2003; pp. 1269-1272; , vol. 300.

Kenji Nomura et al.; "Room-temperature fabrication of transparent flexible thin-film transistors using amorphous oxide semiconductors"; Nature; Nov. 25, 2004; pp. 488-492; vol. 432.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temprature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabalized Liquid Crystal Blue Phases,"Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1982, vol. 46, No. 18, pp. 1216-1219.

Miyasaka, M, "Suftla Flexible Microelectronics on Their Way to Business," SID Digest '07 : SID International Symposium Digest of Technical Papers, 2007, vol 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Noboru Kimizuka et al.; "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"; Journal of Solid State Chemistry; Apr. 1, 1995; pp. 170-178; vol. 116, No. 1.

Masaki Nakamura et al.; "Syntheses and crystal structures of new homologous compounds, indium iron zinc oxides (InFeO3(ZnO)m) (m:natural number) and related compounds"; Kotai Butsuri (Solid State Physics); 1993; pp. 317-327; vol. 28, No. 5 {with Full English translation}; dated in 1993.

Kenji Nomura et al.; "Thin-Film Transistor Fabricated in Single-Crystalline Transparent Oxide Semiconductor"; Science; May 23, 2003; pp. 1269-1272; , vol. 300, No. 5623.

International Search Report, PCT Application No. PCT/JP2011/066622, dated Oct. 11, 2011, 5 pages.

(56) References Cited

OTHER PUBLICATIONS

Written Opinion, PCT Application No. PCT/JP2011/066622, dated Oct. 11, 2011, 5 pages.
Taiwanese Office Action (Application No. 100126776) Dated Sep. 2, 2015.

* cited by examiner

SEMICONDUCTOR DEVICE AND MANUFACTURING METHOD THEREOF

TECHNICAL FIELD

The present invention relates to semiconductor devices. Here, semiconductor devices refer to general elements and devices which function utilizing semiconductor characteristics.

BACKGROUND ART

There are a wide variety of metal oxides and such metal oxides are used for various applications. Indium oxide is a well-known material and has been used for transparent electrodes required in liquid crystal display devices or the like.

Some metal oxides have semiconductor characteristics. The examples of such metal oxides having semiconductor characteristics are, for example, tungsten oxide, tin oxide, indium oxide, and zinc oxide. Thin film transistors in which channel formation regions are formed using such metal oxides are already known (for example, see Patent Documents 1 to 4, Non-Patent Document 1, and the like).

As metal oxides, not only single-component oxides but also multi-component oxides are known. For example, $InGaO_3(ZnO)_m$ (m: natural number) having a homologous phase is known as a multi-component oxide semiconductor containing In, Ga, and Zn (for example, see Non-Patent Documents 2 to 4 and the like).

Furthermore, it is confirmed that an oxide semiconductor containing such an In—Ga—Zn-based oxide is also applicable to a channel formation region of a thin film transistor (for example, see Patent Document 5, Non-Patent Documents 5 and 6, and the like).

REFERENCE

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

Also in the case of a transistor including an oxide semiconductor, it is important to miniaturize the transistor in order to achieve high-speed operation, low power consumption, cost reduction, or the like of the transistor.

Meanwhile, however, a defect caused when a transistor is miniaturized is a major problem. For example, such a problem due to miniaturization of a transistor is that a mask used in processing a conductive layer into a wiring or an electrode is misaligned, so that a transistor cannot be manufactured according to designed dimension. Particularly when a gate electrode is formed in manufacture of a top-gate transistor, it is preferable to form the gate electrode in a region which is over an oxide semiconductor layer and sandwiched between a source electrode and a drain electrode; however, it is difficult to form the gate electrode precisely in the region because the region is significantly narrowed by miniaturization of the transistor.

When a wide gate electrode is formed so as to sufficiently overlap with a region which is over an oxide semiconductor layer and sandwiched between a source electrode and a drain electrode, a region where the gate electrode overlaps with the source electrode or the drain electrode of the transistor is excessively large. Thus, parasitic capacitance might be increased.

It is known that a transistor including an oxide semiconductor has a lower off-state current than a transistor including silicon at room temperature. However, when a gate electrode is misaligned or parasitic capacitance of a transistor is increased as described above, it is not possible to make use of characteristics of a transistor including an oxide semiconductor, which is typified by a low off-state current. On the contrary, performance and yield of a semiconductor device using the transistor might be decreased.

In view of the above, it is an object of one embodiment of the disclosed invention to provide a method for manufacturing a semiconductor device, which enables miniaturization and reduction of defects.

One embodiment of the disclosed invention is a method for manufacturing a semiconductor device, which includes the following steps. An oxide semiconductor layer, a source electrode and a drain electrode which are in contact with the oxide semiconductor layer, an insulating layer over the source electrode, and an insulating layer over the drain electrode are formed over an insulating surface. A gate insulating layer is formed over the oxide semiconductor layer, the source electrode, the drain electrode, and the insulating layer. A conductive layer is formed over the gate insulating layer so as to overlap with at least part of a region sandwiched between the source electrode and the drain electrode. An insulating film is formed so as to cover the conductive layer. The insulating film is processed so that at least part of a region of the conductive layer, which overlaps with the source electrode or the drain electrode, is exposed.

The exposed region of the conductive layer is etched to form a gate electrode overlapping with at least part of the region sandwiched between the source electrode and the drain electrode, in a self-aligned manner.

In the above, it is preferable that a portion of the gate electrode, which is over the uppermost surface of the gate insulating layer, do not overlap with the source electrode and the drain electrode.

Another embodiment of the disclosed invention is a method for manufacturing a semiconductor device, which includes the following steps. An oxide semiconductor layer, a source electrode and a drain electrode which are in contact with the oxide semiconductor layer, an insulating layer over the source electrode, and an insulating layer over the drain electrode are formed over an insulating surface. A gate insulating layer is formed over the oxide semiconductor layer, the source electrode, the drain electrode, and the insulating layer. A conductive layer is formed over the gate insulating layer so as to overlap with at least part of a region sandwiched between the source electrode and the drain electrode. The conductive layer is processed so that at least part of a region of the gate insulating layer, which overlaps with the source electrode or the drain electrode, is exposed in order to form a gate electrode overlapping with at least part of the region sandwiched between the source electrode and the drain electrode, in a self-aligned manner.

In the above, the top surface of the gate electrode is preferably at a level lower than that of the uppermost surface of the gate insulating layer.

The source electrode and the drain electrode may be in contact with at least part of the top surface of the oxide semiconductor layer, or the oxide semiconductor layer may be in contact with at least parts of the top surfaces of the source electrode and the drain electrode. Further, part of the conductive layer, which is left in formation of the gate electrode, may be processed to form a wiring. The distance between the edges of the source electrode and the drain electrode is preferably greater than or equal to 10 nm and less than or equal to 200 nm.

Note that semiconductor devices herein refer to general devices which function by utilizing semiconductor characteristics. For example, a display device, a storage device, an integrated circuit, and the like are included in the category of the semiconductor device.

In the above semiconductor devices, a semiconductor is not limited to an oxide semiconductor. For example, an amorphous semiconductor, a microcrystalline semiconductor, a polycrystalline semiconductor, a single crystal semiconductor, or the like made of silicon, germanium, silicon germanium, silicon carbide, gallium arsenide, or the like may be used.

In this specification and the like, the terms "over" and "below" do not necessarily mean "directly on" and "directly under", respectively, in the description of a positional relationship between components. For example, the expression "a gate electrode over a gate insulating layer" can mean the case where there is an additional component between the gate insulating layer and the gate electrode.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

According to one embodiment of the disclosed invention, in a miniaturized transistor, a gate electrode can be formed in a region which is over an oxide semiconductor layer and sandwiched between a source electrode and a drain electrode precisely and easily and the gate electrode can be prevented from overlapping with the source electrode and the drain electrode, so that an increase in parasitic capacitance can be suppressed.

With such an effect, a problem accompanied with miniaturization can be solved. As a result, the size of a transistor can be sufficiently reduced. When the size of the transistor is sufficiently reduced, an area occupied by a semiconductor device is also reduced, which leads to an increase in the number of semiconductor devices manufactured from one substrate. Accordingly, the manufacturing cost of the semiconductor device can be reduced. Further, since the semiconductor device is downsized, a semiconductor device which is substantially the same as a conventional semiconductor device in size and has a further improved function can be realized. Furthermore, effects of high-speed operation, low power consumption, and the like of a transistor can be obtained in accordance with a reduction in channel length. Thus, miniaturization of a transistor including an oxide semiconductor can be achieved according to one embodiment of the disclosed invention, and various effects accompanied with the miniaturization can be obtained.

As described above, according to one embodiment of the disclosed invention, a method for manufacturing a semiconductor device, which enables miniaturization and reduction of defects, can be provided.

BEST MODE FOR CARRYING OUT THE INVENTION

Figure 1A:
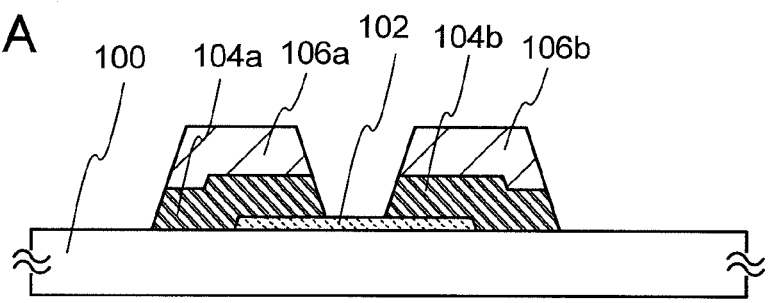
FIGS. 1A to 1D are cross-sectional views relating to manufacturing steps of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, embodiments of a semiconductor device and a method for manufacturing the semiconductor device will be described with reference to FIGS. 1A to 6C.

FIGS. 1A to 1D, FIGS. 2A and 2B, and FIGS. 3A and 3B are cross-sectional views illustrating manufacturing steps of a transistor 200 as an example of a method for manufacturing a semiconductor device according to one embodiment of the disclosed invention. Here, the transistor 200 in FIG. 2B includes, over a substrate 100, an oxide semiconductor layer 102, a source electrode 104a, a drain electrode 104b, an insulating layer 106a, an insulating layer 106b, a gate insulating layer 108, and a gate electrode 110a. In addition, a wiring 110c including the same material as the gate electrode 110a is formed over the gate insulating layer 108.

Here, the channel length L of the transistor 200 is preferably greater than or equal to 10 nm and less than or equal to 200 nm, more preferably greater than or equal to 20 nm and less than or equal to 100 nm. Thus, the channel length L is made small in order to miniaturize the transistor, so that an increase in operation speed and a reduction in power consumption of the transistor can be achieved. Note that in this specification, the channel length L depends on the distance between the edges of the source electrode 104a and the drain electrode 104b.

The gate electrode 110a provided over the gate insulating layer 108 overlaps with at least part of a region which is over the oxide semiconductor layer 102 and sandwiched between the source electrode 104a and the drain electrode 104b. Further, it is preferable that a portion of the gate electrode 110a, which is over the uppermost surface of the gate insulating layer 108, do not overlap with the source electrode 104a and the drain electrode 104b. With such a structure, the gate electrode 110a can be precisely formed in the region which is over the oxide semiconductor layer 102 and sandwiched between the source electrode 104a and the drain electrode 104b, and an increase in parasitic capacitance can be suppressed. Therefore, the transistor 200 can have desired transistor characteristics as designed. Note that in this specification, the uppermost surface of a gate insulating layer refers to part of a surface of the gate insulating layer, which overlaps with a source electrode or a drain electrode and is parallel with a substrate. In the case where each of the source electrode 104a, the drain electrode 104b are tapered, and a portion of the gate electrode 110a, which is below the uppermost surface of the gate insulating layer 108, is inversely tapered, the inverse tapered portion of the gate electrode 110a, which is below the uppermost surface of the gate insulating layer 108, may overlap with the source electrode 104a and the drain electrode 104b. In that case, the portion of the gate electrode 110a, which is over the uppermost surface of the gate insulating layer 108, may overlap with the source electrode 104a and the drain electrode 104b.

An example of a manufacturing process of the transistor 200 in FIG. 2B will be described with reference to FIGS. 1A to 1D, FIGS. 2A and 2B, and FIGS. 3A and 3B.

First, the oxide semiconductor layer 102 and the source electrode 104a and the drain electrode 104b which are in contact with the oxide semiconductor layer 102 are formed over the substrate 100 having an insulating surface (see FIG. 1A). In the structure illustrated in FIG. 1A, after the oxide semiconductor layer 102 is formed over the substrate 100, a conductive layer is formed and etched to form the source electrode 104a and the drain electrode 104b so that they are partly in contact with parts of the top surface of the oxide semiconductor layer 102.

Although there is no particular limitation on a material or the like of the substrate 100, it is necessary that the substrate have at least heat resistance to heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. In the case where the transistor is provided over a flexible substrate, for example, the transistor can be directly formed over the flexible substrate.

Here, a base insulating layer is preferably formed over the substrate 100 before the oxide semiconductor layer 102 is formed. The base insulating layer can be formed using a material and a method similar to those of the gate insulating layer 108 to be described later.

As a material used for the oxide semiconductor layer 102, any of the following materials can be used: a four-component metal oxide such as an In—Sn—Ga—Zn—O-based material; three-component metal oxides such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above material may contain $SiO_2$. Here, for example, an In—Ga—Zn—O-based material refers to an oxide film containing indium (In), gallium (Ga), and zinc (Zn), and there is no particular limitation on the composition ratio. Further, the In—Ga—Zn—O-based material may contain an element other than In, Ga, and Zn.

The oxide semiconductor layer 102 may be a thin film including a material expressed by the chemical formula, $InMO_3(ZnO)_m$ (m>0). Here, M represents one or more metal elements selected from Ga, Al, Mn, and Co. For example, M may be Ga, Ga and Al, Ga and Mn, Ga and Co, or the like.

The thickness of the oxide semiconductor layer 102 is desirably greater than or equal to 3 nm and less than or equal to 30 nm. This is because the transistor might possibly be normally on when the oxide semiconductor layer 102 is too thick (e.g., the thickness is 50 nm or more).

The oxide semiconductor layer is preferably formed by a method in which impurities such as hydrogen, water, a hydroxyl group, and hydride are less likely to enter the oxide semiconductor layer. For example, a sputtering method can be used.

In this embodiment, the oxide semiconductor layer is formed by a sputtering method using an In—Ga—Zn—O-based oxide semiconductor deposition target.

As the In—Ga—Zn—O-based oxide semiconductor deposition target, for example, an oxide semiconductor deposition target with the following composition ratio can be used: the composition ratio of $In_2O_3:Ga_2O_3:ZnO$ is 1:1:1 [molar ratio]. Note that it is not necessary to limit the material and the composition of the oxide semiconductor deposition target to the above. For example, an oxide semiconductor deposition target with the following composition ratio may alternatively be used: the following composition ratio of $In_2O_3:Ga_2O_3:ZnO$ is 1:1:2 [molar ratio].

In the case where an In—Zn—O-based material is used for the oxide semiconductor, a target with the following composition ratio is used: the composition ratio of In:Zn is 50:1 to 1:2 in an atomic ratio ($In_2O_3:ZnO$=25:1 to 1:4 in a molar ratio), preferably 20:1 to 1:1 in an atomic ratio ($In_2O_3:ZnO$=10:1 to 1:2 in a molar ratio), more preferably 15:1 to 1.5:1 in an atomic ratio ($In_2O_3:ZnO$=15:2 to 3:4 in a molar ratio). For example, a target used for the formation of an In—Zn—O-based oxide semiconductor has the following atomic ratio: the atomic ratio of In:Zn:O is X:Y:Z, where Z>1.5X+Y.

The fill rate of the oxide semiconductor deposition target is higher than or equal to 90% and lower than or equal to 100%, preferably higher than or equal to 95% and lower than or equal to 99.9%. This is because with the use of the oxide semiconductor deposition target with a high fill rate, a dense oxide semiconductor layer can be formed.

The deposition atmosphere may be a rare gas (typically argon) atmosphere, an oxygen atmosphere, or a mixed atmosphere containing a rare gas and oxygen. Further, in order to prevent impurities such as hydrogen and water from entering the oxide semiconductor layer, it is preferable to use an atmosphere of a high-purity gas in which impurities such as hydrogen and water are sufficiently removed.

For example, the oxide semiconductor layer can be formed as follows.

First, the substrate 100 is placed in a deposition chamber kept under reduced pressure, and heating is performed so that the substrate temperature is higher than 200° C. and lower than or equal to 500° C., preferably higher than 300° C. and lower than or equal to 500° C., more preferably higher than or equal to 350° C. and lower than or equal to 450° C.

Then, a high-purity gas in which impurities such as hydrogen and water are sufficiently removed is introduced into the deposition chamber from which remaining moisture is being removed, and the oxide semiconductor layer is formed over the substrate 100 with the use of the oxide semiconductor deposition target. To remove moisture remaining in the deposition chamber, an entrapment vacuum pump such as a cryopump, an ion pump, or a titanium sublimation pump is desirably used. Further, an evacuation means may be a turbo pump provided with a cold trap. In the deposition chamber which is evacuated with the cryopump, impurities such as hydrogen and water (more preferably, also a compound containing a carbon atom), and the like are removed, whereby the concentration of impurities such as hydrogen and water in the oxide semiconductor layer formed in the deposition chamber can be reduced.

When the substrate temperature is low (e.g., lower than or equal to 100° C.) during deposition, impurities such as hydrogen and water might enter the oxide semiconductor layer; therefore, the substrate 100 is preferably heated at the above temperature. When the oxide semiconductor layer is formed with the substrate 100 heated at the above temperature, the substrate temperature is increased; thus, hydrogen bonds are cut due to heat and are less likely to be taken into the oxide semiconductor layer. Therefore, the oxide semiconductor layer is formed with the substrate 100 heated at the above temperature, whereby the concentration of impurities such as hydrogen and water in the oxide semiconductor layer can be sufficiently reduced. Moreover, damage due to sputtering can be reduced.

Note that, as a method for measuring the amount of water in the oxide semiconductor layer, thermal desorption spectroscopy (TDS) is given. For example, when the temperature is increased from room temperature to approximately 400° C., elimination of water, hydrogen, a hydroxyl group, and the like in the oxide semiconductor layer can be observed in the range of approximately 200° C. to 300° C.

An example of the deposition condition is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the flow rate of the oxygen is 100%). Note that a pulse direct current power source is preferably used because powdery substances (also referred to as particles or dust) generated in deposition can be reduced and the film thickness can be even.

Note that before the oxide semiconductor layer is formed by a sputtering method, powdery substances (also referred to as particles or dust) attached on a surface of the substrate 100 are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas such as nitrogen, helium, or oxygen may be used.

The oxide semiconductor layer can be processed by being etched after a mask having a desired shape is formed over the oxide semiconductor layer. The mask can be formed by a method such as photolithography or an ink-jet method. For the etching of the oxide semiconductor layer, either wet etching or dry etching may be employed. It is needless to say that both of them may be employed in combination.

The oxide semiconductor layer 102 formed in such a manner may be subjected to heat treatment. Impurities such as hydrogen and water in the oxide semiconductor layer 102 are further reduced through the heat treatment, so that the structure of the oxide semiconductor layer 102 is modified and defect levels in an energy gap can be reduced.

The heat treatment is performed in an inert gas atmosphere at higher than or equal to 250° C. and lower than or equal to 700° C., preferably higher than or equal to 450° C. and lower than or equal to 600° C. or lower than the strain point of the substrate. As the inert gas atmosphere, an atmosphere that contains nitrogen or a rare gas (e.g., helium, neon, or argon) as its main component and does not contain impurities such as hydrogen and water is desirably used. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a manner that, for example, an object to be heated is introduced into an electric furnace in which a resistance heating element or the like is used, and heated in a nitrogen atmosphere at 450° C. for an hour. The oxide semiconductor layer 102 is not exposed to the air during the heat treatment so that entry of impurities such as hydrogen and water can be prevented.

The above heat treatment can be referred to as dehydration treatment, dehydrogenation treatment, or the like because of its advantageous effect of removing impurities such as hydrogen and water. The heat treatment can be performed at the timing, for example, after the oxide semiconductor layer is formed. Such dehydration treatment or dehydrogenation treatment may be conducted once or plural times.

Next, treatment for supplying oxygen (also referred to as oxygen doping treatment, or the like) is desirably performed on the oxide semiconductor layer 102. As the treatment for supplying oxygen, heat treatment in an oxygen atmosphere, treatment with oxygen plasma, and the like are given. Alternatively, oxygen may be added by performing exposure to an oxygen ion accelerated by an electric field.

Note that an electric bias may be applied to the substrate in order to add oxygen more favorably.

By performing oxygen doping treatment on the oxide semiconductor layer 102, the oxygen can be contained either or both in the oxide semiconductor layer 102 or/and in the vicinity of the interface of the oxide semiconductor layer 102. In that case, the oxygen content is desirably approximately higher than that in the stoichiometric ratio of the oxide semiconductor layer.

Note that heat treatment may be performed on the oxide semiconductor layer 102 which has been subjected to the oxygen doping treatment. The heat treatment is performed at a temperature higher than or equal to 250° C. and lower than or equal to 700° C., preferably higher than or equal to 400° C. and lower than or equal to 600° C. or lower than the strain point of the substrate.

Through the heat treatment, water, a hydroxide (OH), and the like generated by reaction between oxygen and hydrogen contained in the oxide semiconductor layer can be removed from the oxide semiconductor layer. Further, through this heat treatment, hydrogen or the like that has entered the oxide semiconductor layer 102 or the like during the above oxygen doping treatment can also be removed. The heat treatment may be performed in an atmosphere of nitrogen, oxygen, an ultra-dry air (an air where the moisture content is 20 ppm (−55° C. by conversion into a dew point) or less, preferably 1 ppm or less, more preferably 10 ppb or less when measurement is performed using a dew-point instrument of a cavity ring-down spectroscopy (CRDS) system), a rare gas (e.g., argon or helium), or the like in which water, hydrogen, and the like are sufficiently reduced. In particular, the heat treatment is preferably performed in an atmosphere containing oxygen. The purity of nitrogen, oxygen, or the rare gas which is introduced into the heat treatment apparatus is set to preferably 6N (99.9999%) or higher (that is, the impurity concentration is 1 ppm or lower), more preferably 7N (99.99999%) or higher (that is, the impurity concentration is 0.1 ppm or lower).

Note that the timing of the oxygen doping treatment is not limited to the timing described above. However, the oxygen doping treatment is desirably performed after the heat treatment for dehydration or the like.

The source electrode 104a and the drain electrode 104b are formed in such a manner that a conductive layer is formed over the oxide semiconductor layer 102 by a sputtering method, a vacuum evaporation method, or the like and processed. The source electrode 104a and the drain electrode 104b are thus formed, thereby being in contact with parts of the top surface of the oxide semiconductor layer 102. When the thicknesses of the source electrode 104a and the drain electrode 104b are increased, there are not only an effect of reducing the resistance of the electrodes and wirings thereof but also an effect of reducing the resistance of the gate electrode 110a because the thickness of the gate electrode 110a can also be increased as described later. Meanwhile, parasitic capacitance between the gate electrode 110a and the source and drain electrodes 104a and 104b increases. Thus, here, the thicknesses of the source electrode 104a and the drain electrode 104b are each greater than or equal to 50 nm and less than or equal to 500 nm, for example.

Note that the channel length L of the transistor depends on the distance between the edges of the source electrode 104a and the drain electrode 104b which are formed here. The channel length L of the transistor is preferably greater than or equal to 10 nm and less than or equal to 200 nm, more preferably greater than or equal to 20 nm and less than or equal to 100 nm.

As the conductive layer used for the source electrode 104a and the drain electrode 104b, for example, a metal film containing an element selected from aluminum, chromium, copper, tantalum, titanium, molybdenum, and tungsten, or a metal nitride film containing any of the above elements as its component (e.g., a titanium nitride film, a molybdenum nitride film, or a tungsten nitride film) can be used. The source electrode 104a and the drain electrode 104b may be formed to have a single-layer structure or a layered structure. Alternatively, a structure may be employed in which a high-melting-point metal film of titanium, molybdenum, tungsten, or the like or a metal nitride film of any of these elements (a titanium nitride film, a molybdenum nitride film, or a tungsten nitride film) may be provided over and/or below a metal film of aluminum, copper, or the like.

Alternatively, the conductive layer used for the source electrode 104a and the drain electrode 104b may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials containing silicon oxide can be used.

The conductive layer can be processed by being etched after a mask having a desired shape is formed over the conductive layer. As the above mask, a resist mask or the like can be used. Ultraviolet light, KrF laser light, ArF laser light, or the like is preferably used for light exposure in formation of the resist mask.

In the case where the channel length L is less than 25 nm, the light exposure at the time of forming the resist mask is preferably performed using, for example, extreme ultraviolet light having an extremely short wavelength of several nanometers to several tens of nanometers. In the light exposure with extreme ultraviolet light, the resolution is high and the focus depth is large. Thus, the channel length L of the transistor can be reduced, and the operation speed of a circuit can be increased.

An etching step may be performed with the use of a resist mask formed using a so-called multi-tone mask. A resist mask formed using a multi-tone mask has a plurality of thicknesses and can be further changed in shape by aching; thus, such a resist mask can be used in a plurality of etching steps for different patterns. Therefore, a resist mask for at least two kinds of patterns can be formed using a multi-tone mask, resulting in simplification of the process.

Either wet etching or dry etching may be employed for the etching of the conductive layer to be the source electrode 104a and the drain electrode 104b; dry etching is preferably employed in terms of microfabrication. The etching conditions (e.g., an etching gas or an etching solution, etching time, and temperature) are set as appropriate depending on the material so that the conductive layer can be etched to have a desired shape. In the case where the conductive layer to be the source electrode 104a and the drain electrode 104b is etched by dry etching, chlorine ($Cl_2$), boron trichloride ($BCl_3$), silicon tetrachloride ($SiCl_4$), tetrafluoromethane ($CF_4$), sulfur hexafluoride ($SF_6$), nitrogen trifluoride ($NF_3$), or the like can be used as an etching gas. Further, a mixed gas containing some of the above gases may be used. Furthermore, a rare gas (helium (He) or argon (Ar)), oxygen, or the like may be added to the above gas.

As illustrated in FIG. 1A, the source electrode 104a and the drain electrode 104b may be tapered. The taper angle is larger than or equal to 45° and smaller than 90° and can preferably be larger than or equal to 60° and smaller than or equal to 80°. When the source electrode 104a and the drain electrode 104b are tapered as described above, coverage of the source electrode 104a and the drain electrode 104b with the gate insulating layer 108 which is formed later can be improved and disconnection of the gate insulating layer 108 can be prevented. Note that the taper angle refers to a tilt angle formed by a side surface and the bottom surface of a layer having a tapered shape (e.g., the source electrode 104a or the drain electrode 104b) in the case where the layer is observed from a direction perpendicular to a cross section thereof.

Note that in the etching of the conductive layer, part of the oxide semiconductor layer 102 is etched, so that the oxide semiconductor layer 102 having a groove (recessed portion) is formed in some cases.

After that, by plasma treatment using a gas such as $N_2O$, $N_2$, or Ar, impurities such as hydrogen and water attached to a surface of an exposed portion of the oxide semiconductor layer 102 may be removed.

Next, an insulating layer is formed so as to cover the oxide semiconductor layer 102, the source electrode 104a, and the drain electrode 104b and processed using a photomask, so that an insulating layer 106a and an insulating layer 106b are formed over the source electrode 104a and the drain electrode 104b, respectively (see FIG. 1A).

Here, the insulating layer 106a and the insulating layer 106b can be formed using a material such as silicon oxide, silicon nitride, silicon oxynitride, or silicon nitride oxide by a CVD method, a sputtering method, or the like. The thicknesses of the insulating layer 106a and the insulating layer 106b are each preferably greater than or equal to 10 nm and less than or equal to 500 nm.

The insulating layer 106a and the insulating layer 106b are formed in such a manner that a resist mask is formed over an insulating layer and etching is performed using the resist mask. The resist mask can be formed by the same method as the method employed for formation of the source electrode 104a and the drain electrode 104b, and it is preferable to use the photomask used for formation of the source electrode 104a and the drain electrode 104b. Either wet etching or dry etching may be employed for the etching of the insulating layer; dry etching is preferably employed in terms of microfabrication. The etching conditions (e.g., an etching gas or an etching solution, etching time, and temperature) are set as appropriate depending on the material so that the insulating layer can be etched to have a desired shape. Note that dry etching is preferably employed in terms of reduction in channel length (L) of the transistor. As an etching gas used in dry etching, for example, a gas containing fluorine such as sulfur hexafluoride ($SF_6$), nitrogen trifluoride ($NF_3$), trifluoromethane ($CHF_3$), or octafluorocyclobutane ($C_4F_8$), a mixed gas of tetrafluoromethane ($CF_4$) and hydrogen, or the like can be used. Furthermore, a rare gas (e.g., helium (He), argon (Ar), or xenon (Xe)), carbon monoxide, carbon dioxide, or the like may be added to the above gas.

By thus forming the insulating layer 106a and the insulating layer 106b, a recessed portion in a region sandwiched between the source electrode 104a and the drain electrode 104b can be deep, so that the gate electrode 110a which is formed later can be sufficiently thick. Thus, loss of the gate electrode 110a which is formed later or significant reduction in thickness of the gate electrode 110a can be prevented. Accordingly, sufficient conductivity of the gate electrode 110a can be maintained.

Note that the insulating layer 106a and the insulating layer 106b are not necessarily formed. For example, in the case where the source electrode 104a and the drain electrode 104b are sufficiently thick, the insulating layer 106a and the insulating layer 106b are not necessarily formed because even when the insulating layer 106a and the insulating layer 106b are not formed, the gate electrode 110a can be sufficiently thick.

Note that the method is described here in which the source electrode 104a and the drain electrode 104b are formed and then the insulating layer 106a and the insulating layer 106b are formed; however, this embodiment is not limited thereto. For example, in the case where the source electrode 104a and the drain electrode 104b are formed in contact with parts of the top surface of the oxide semiconductor layer 102, after a conductive layer is formed over the oxide semiconductor layer 102 and an insulating layer is formed over the conductive layer, the insulating layer and the conductive layer are processed using one resist mask so that the insulating layer 106a, the insulating layer 106b, the source electrode 104a, and the drain electrode 104b can be formed. By forming the insulating layer 106a, the insulating layer 106b, the source electrode 104a, and the drain electrode 104b in such a manner, the edges of the insulating layer 106a and the insulating layer 106b can be substantially aligned with the edges of the source electrode 104a and the drain electrode 104b, respectively. Thus, misalignment between the insulating layer 106a and the source electrode 104a and between the insulating layer 106b and the drain electrode 104b can be prevented. Further, the number of photomasks can be reduced, resulting in cost reduction of the semiconductor device. Note that the expression "substantially aligned" does not always refer to exact alignment. For example, the expression "substantially aligned" includes a degree of alignment in a shape obtained by etching a plurality of layers with the use of one mask.

Figure 1B:
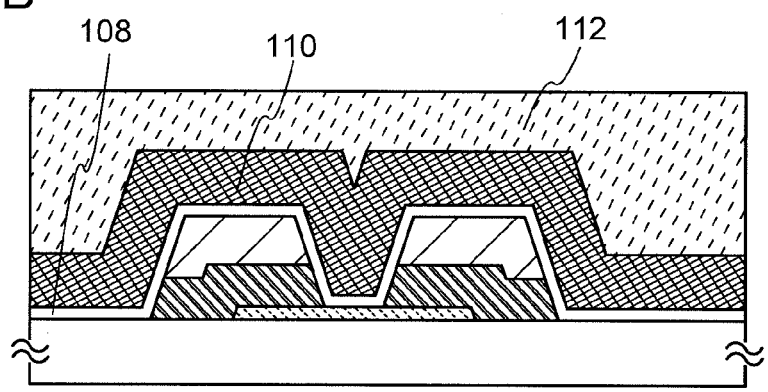
Figure 1C:
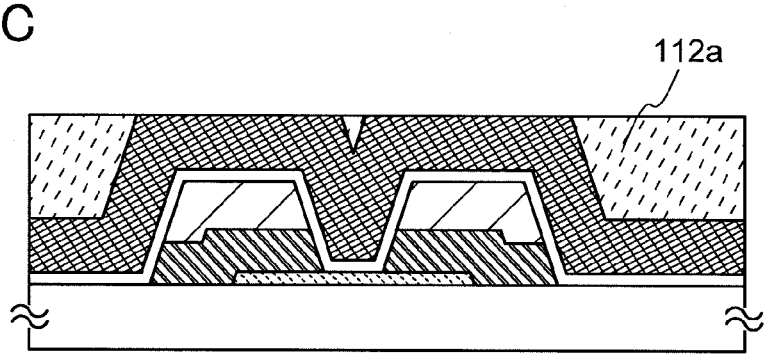

Next, the gate insulating layer 108 is formed over the oxide semiconductor layer 102, the source electrode 104a, the drain electrode 104b, the insulating layer 106a, and the insulating layer 106b (see FIG. 1B).

For example, the gate insulating layer 108 is formed using a material such as silicon oxide, silicon nitride, silicon oxynitride, or silicon nitride oxide. The gate insulating layer 108 may be formed using a material containing gallium oxide. The material containing gallium oxide may further contain aluminum oxide; that is, a material containing aluminum gallium oxide or gallium aluminum oxide, or the like may be used. Here, aluminum gallium oxide refers to a material in which the aluminum content is higher than the gallium content in atomic percent, and gallium aluminum oxide refers to a material in which the gallium content is higher than or equal to the aluminum content in atomic percent. Further, a material having a high dielectric constant, such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added may be used. The gate insulating layer 108 can be formed to have a single-layer structure or a layered structure using any of the above materials.

In the case where a gallium oxide film is used for the gate insulating layer 108, the composition of the gallium oxide film is preferably $Ga_2O_{3+\alpha}$ ($\alpha$>0). It is preferable that $\alpha$ be greater than or equal to 3.04 and less than or equal to 3.09. Alternatively, in the case where an aluminum gallium oxide film is used for the gate insulating layer 108, the composition of the aluminum gallium oxide film is preferably $Al_xGa_{2-x}O_{3+\alpha}$ (1<x<2, $\alpha$>0). Still alternatively, in the case where a gallium aluminum oxide film is used for the gate insulating layer 108, the gallium aluminum oxide film preferably has a composition of $Al_xGa_{2-x}O_{3+\alpha}$ (0<x≤1, $\alpha$>0) by being doped with oxygen.

In many cases, an oxide semiconductor material used for the oxide semiconductor layer contains gallium. Therefore, in the case where the gate insulating layer 108 is formed in contact with the oxide semiconductor layer with the use of a material containing gallium oxide, a favorable condition can be maintained at the interface between the oxide semiconductor layer and the gate insulating layer 108. For example, when the oxide semiconductor layer and an insulating layer containing gallium oxide are provided in contact with each other, an accumulation of hydrogen at the interface between the oxide semiconductor layer and the insulating layer can be reduced. This is because a material containing gallium oxide is compatible with an oxide semiconductor material.

Note that, in the case where an element belonging to the same group as a constituent element of the oxide semiconductor is used for the gate insulating layer 108, a similar effect can be obtained. That is, it is also effective to additionally use a material containing aluminum oxide or the like in formation of the gate insulating layer 108. Note that water is not likely to permeate aluminum oxide; therefore, it is preferable to use aluminum oxide in terms of preventing water from entering the oxide semiconductor layer. For example, the above material such as aluminum gallium oxide (or gallium aluminum oxide) containing gallium and aluminum may be used for the gate insulating layer 108. In that case, both the effect resulting from containing gallium and the effect resulting from containing aluminum can be obtained, which is preferable. For example, by providing an insulating layer containing aluminum gallium oxide in contact with the oxide semiconductor layer, water can be prevented from entering the oxide semiconductor layer and an accumulation of hydrogen at an interface between the oxide semiconductor layer and the insulating layer can be sufficiently reduced.

The gate insulating layer 108 is preferably formed by a method with which impurities such as hydrogen and water do not enter the gate insulating layer 108. This is because when an impurity such as hydrogen or water is contained in the gate insulating layer 108, the impurity such as hydrogen or water enters the oxide semiconductor layer or oxygen in the oxide semiconductor layer is extracted by the impurity such as hydrogen or water, so that the oxide semiconductor layer might have lower resistance (have n-type conductivity). Therefore, the gate insulating layer 108 is preferably formed so as to contain as few impurities such as hydrogen and water as possible. For example, the gate insulating layer 108 is preferably formed by a sputtering method, and a high-purity gas in which impurities such as hydrogen and water are removed is preferably used as a sputtering gas used for deposition.

As a sputtering method, a DC sputtering method in which a direct current power source is used, a pulsed DC sputtering method in which a direct current bias is applied in a pulsed manner, an AC sputtering method, or the like can be employed.

After formation of the gate insulating layer 108, heat treatment is desirably performed in an inert gas atmosphere or an oxygen atmosphere. The temperature of the heat treatment is set to higher than or equal to 200° C. and lower than or equal to 450° C., desirably higher than or equal to 250° C. and lower than or equal to 350° C. For example, the heat treatment may be performed at 250° C. for an hour in a nitrogen atmosphere. By performing the heat treatment, variation in electrical characteristics of the transistor can be reduced. In the case where the gate insulating layer 108 contains oxygen, oxygen can be supplied to the oxide semiconductor layer 102 so that oxygen vacancies in the oxide semiconductor layer 102 are filled. In this sense, the heat treatment can also be referred to as heat treatment for supply of oxygen.

Note that in this embodiment, the heat treatment for supply of oxygen is performed after the gate insulating layer 108 is formed; however, the timing of the heat treatment for supply of oxygen is not limited thereto. For example, the heat treatment for supply of oxygen may be performed after the gate electrode 110a is formed. The heat treatment for supply of oxygen may be performed following heat treatment for dehydration or dehydrogenation.

As described above, the heat treatment for dehydration or dehydrogenation, and the oxygen doping treatment or the heat treatment for supply of oxygen are performed to reduce impurities and fill oxygen vacancies in the oxide semiconductor layer 102, whereby the oxide semiconductor layer 102 can be highly purified so as to contain elements (impurity elements) that are not main components of the oxide semiconductor layer 102 as few as possible. The oxide semiconductor layer 102 which has been highly purified contains extremely few carriers derived from donors.

Next, a conductive layer 110 is formed over the gate insulating layer 108 so as to overlap with at least part of a region sandwiched between the source electrode 104a and the drain electrode 104b (see FIG. 1B).

The conductive layer 110 is used to form the gate electrode 110a and the wiring 110c in a later step. The conductive layer 110 can be formed using a material similar to that used for the conductive layer for formation of the source electrode 104a and the drain electrode 104b. Further, the conductive layer 110 can be formed by a PVD method or a CVD method and is formed such that part of the conductive layer fills a recessed portion sandwiched between the insulating layer 106a and the source electrode 104a, and the insulating layer 106b and the drain electrode 104b.

Then, an insulating film 112 is formed so as to cover the conductive layer 110 (see FIG. 1B). The insulating film 112 functions as a mask used in etching the conductive layer 110. Processed in a later step so that the uppermost surface of the conductive layer 110 is exposed, the insulating film 112 is preferably a planarization insulating film having the top surface parallel to the substrate 100. Note that in this specification, the uppermost surface of the conductive layer 110 refers to part of a surface of the conductive layer 110, which overlaps with the source electrode 104a or the drain electrode 104b and is parallel to the substrate 100.

The planarization insulating film used as the insulating film 112 can be formed using an organic material such as polyimide, an acrylic resin, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. There is no particular limitation on the method of forming the insulating film 112, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. Note that a siloxane-based resin is a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

Figure 3A:
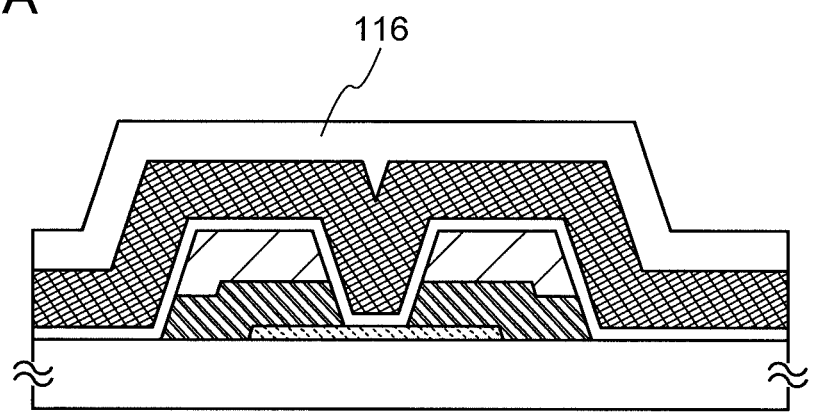
FIGS. 3A and 3B are cross-sectional views relating to manufacturing steps of a semiconductor device.
Figure 3B:
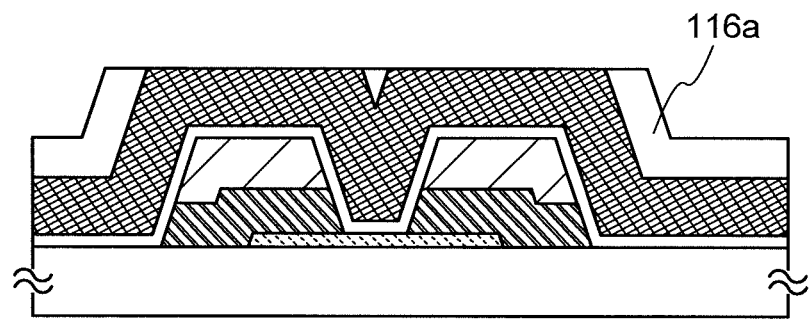

Note that the insulating film functioning as a mask used in etching the conductive layer 110 is not necessarily a planarization insulating film. For example, in the case where the insulating film is processed by CMP treatment or the like in a later step, an insulating film 116 which is not planarized may be formed over the conductive layer 110 as illustrated in FIG. 3A. The insulating film 116 can be formed using a material including an inorganic insulating material such as silicon oxide or silicon oxynitride.

Then, the insulating film 112 is processed so that at least part of a region of the conductive layer 110, which overlaps with the source electrode 104a or the drain electrode 104b, is exposed. Thus, insulating film 112a is formed (see FIG. 1C).

Here, from the entire top surface of the insulating film 112, the insulating film 112 is partly removed at an even rate. When the uppermost surface of the conductive layer 110 is exposed (or when a small portion of the conductive layer 110 is removed after the uppermost surface of the conductive layer 110 is exposed), this operation is stopped. Thus, the insulating film 112a can be formed. Such processing of the insulating film 112 can be performed by ashing treatment, etching treatment, or polishing treatment; the processing method may be selected as appropriate depending on the material of the insulating film 112.

For the ashing treatment of the insulating film 112, for example, oxygen plasma ashing can be employed. The ashing treatment using oxygen plasma is performed in an oxygen atmosphere in such a manner that oxygen is made to be plasma by high frequency power or the like and the insulating film 112 is decomposed and removed by the oxygen made to be plasma. Thus, from the entire top surface of the insulating film 112, the insulating film 112 can be partly removed at an even rate. Further, when the insulating film 112 is partly removed in such a manner, generation of a residue of the insulating film 112 or a reaction product of the residue can be avoided.

Either wet etching or dry etching may be employed for the etching of the insulating film 112. The etching conditions (e.g., an etching gas or an etching solution, etching time, and temperature) are set as appropriate depending on the material so that the insulating film 112 can be etched to have a desired shape. In particular, the etching conditions are set so that the etching selectivity of the insulating film 112 to the conductive layer 110 is sufficiently high.

As the polishing treatment of the insulating film 112, for example, a chemical mechanical polishing (CMP) treatment can be employed. Here, the CMP treatment is treatment of planarizing a surface of an object to be processed by a combination of chemical and mechanical actions using the surface as a reference. In general, the CMP treatment is a method in which a polishing cloth is attached to a polishing stage, and the polishing stage and the object to be processed are each rotated or swung while a slurry (an abrasive) is supplied between the object to be processed and the polishing cloth, whereby the surface of the object to be processed is polished by chemical reaction between the slurry and the surface of the object to be processed and by action of mechanical polishing of the object to be processed with the polishing cloth.

In the case where the insulating film 116 which is not planarized is formed over the conductive layer 110 as illustrated in FIG. 3A, the insulating film 116 may be processed by the CMP treatment. When the insulating film 116 is processed by the CMP treatment, an insulating film 116a can be formed so that the uppermost surface of the conductive layer 110 is exposed as illustrated n FIG. 3B. Note that a step performed after the step in FIG. 3B can also be performed in a manner similar to that in formation of the insulating film 112.

Figure 1D:
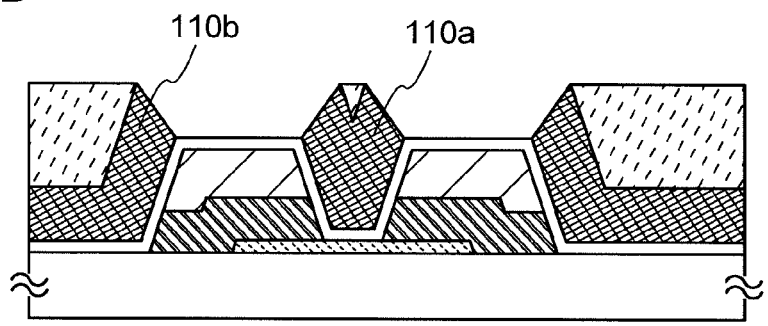

Then, an exposed region of the conductive layer 110 is etched to form the gate electrode 110a which overlaps with at least part of the region sandwiched between the source electrode 104a and the drain electrode 104b, in a self-aligned manner (see FIG. 1D). Here, besides the gate electrode 110a, the conductive layers 110b remain in portions covered with the insulating film 112a.

The conductive layer 110 can be etched in a manner similar to that of the source electrode 104a and the drain electrode 104b, and either wet etching or dry etching may be employed; dry etching is preferably employed in terms of microfabrication. Further, the etching conditions are set as appropriate so that the etching selectivity of the conductive layer 110 to the gate insulating layer 108 is sufficiently high, and etching is performed. In that manner, the conductive layer 110 is etched until the uppermost surface of the gate insulating layer 108 is exposed.

In general, in the case of forming a gate electrode of a transistor with the use of a photomask in such a manner, the gate electrode is misaligned by approximately several nanometers to several hundred nanometers in some cases. When the channel length of the transistor is greater than or equal to 1 μm, a significant problem does not occur. However, in the case of reducing the size of the transistor as in this embodiment, such misalignment might possibly be a defect which severely influences transistor characteristics. However, by forming the gate electrode 110a in a self-aligned manner as described above, the gate electrode 110a can be formed precisely and easily in the region which is over the oxide semiconductor layer 102 and sandwiched between the source electrode 104a and the drain electrode 104b.

Further, in the portion of the gate electrode 110a, which is over the uppermost surface of the gate insulating layer 108, does not overlap with the source electrode 104a and the drain electrode 104b, which leads to suppression of an increase in parasitic capacitance between the gate electrode 110a and the source and drain electrodes 104a and 104b. Thus, a transistor having desired transistor characteristics as designed can be manufactured. Note that in the case where each of the source electrode 104a and the drain electrode 104b are tapered, and the portion of the gate electrode 110a, which is below the uppermost surface of the gate insulating layer 108, is inversely tapered, the inverse tapered portion of the gate electrode 110a, which is below the uppermost surface of the gate insulating layer 108, may overlap with the source electrode 104a and the drain electrode 104b. In that case, the portion of the gate electrode 110a, which is over the uppermost surface of the gate insulating layer 108, may overlap with the source electrode 104a and the drain electrode 104b.

Since the gate electrode 110a can be formed without using a photomask, the number of photomasks used in the whole manufacturing process can be reduced. Accordingly, the cost of the semiconductor device can be reduced.

Figure 2A:
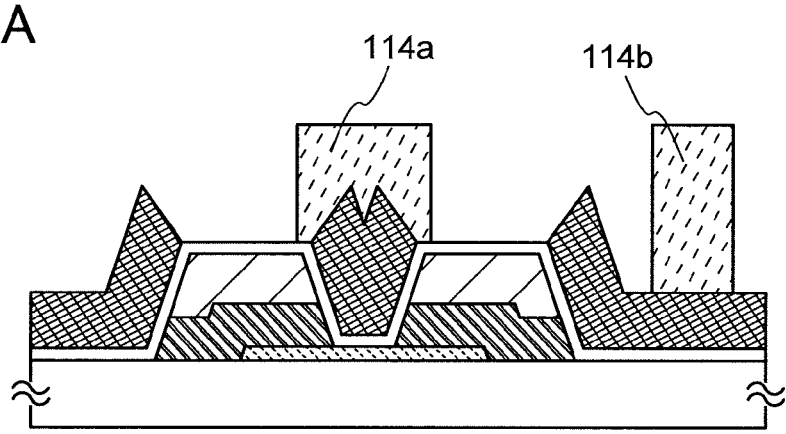
FIGS. 2A and 2B are cross-sectional views relating to manufacturing steps of a semiconductor device.

Next, a resist mask 114a is formed so as to cover the gate electrode 110a, and a resist mask 114b is formed over part of the conductive layer 110b (see FIG. 2A). After that, the conductive layer 110b is processed using the resist mask 114a and the resist mask 114b to form the wiring 110c (see FIG. 2B).

The resist mask 114a and the resist mask 114b can be formed in such a manner that a material such as photosensitive resin is deposited by a spin coating method or the like and then, photolithography is performed using a photomask.

Then, etching is performed in a manner similar to that of the gate electrode 110a, so that the wiring 110c can be formed. Thus, the wiring 110c can be formed utilizing part of the conductive layer 110b left when the gate electrode 110a is formed, resulting in reduction in cost of the semiconductor device.

Figure 2B:
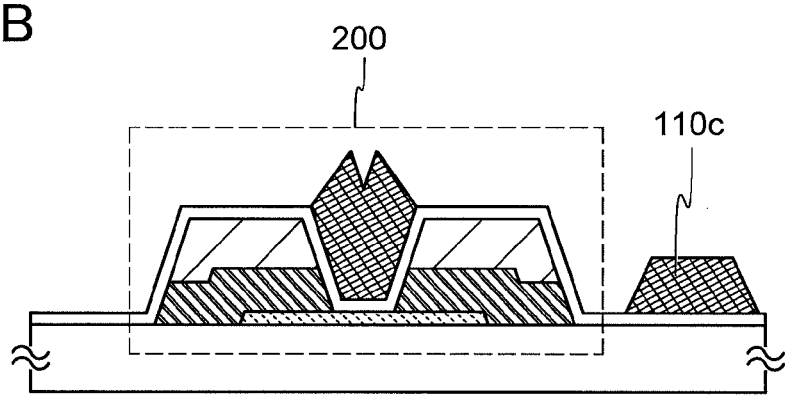

Through the above process, the transistor 200 can be manufactured in which the gate electrode 110a overlaps with the region which is over the oxide semiconductor layer 102 and sandwiched between the source electrode 104a and the drain electrode 104b, while miniaturization thereof is achieved (see FIG. 2B).

As described above, the oxide semiconductor layer 102 used in the transistor 200 is desirably a highly purified oxide semiconductor layer formed by sufficiently removing impurities such as hydrogen and water and sufficiently supplying oxygen. Specifically, the concentration of hydrogen in the oxide semiconductor layer 102 is lower than or equal to $5 \times 10^{19}$ atoms/cm$^3$, desirably lower than or equal to $5 \times 10^{18}$ atoms/cm$^3$, more desirably lower than or equal to $5 \times 10^{17}$ atoms/cm$^3$, for example. Note that the concentration of hydrogen in the oxide semiconductor layer 102 is measured by secondary ion mass spectrometry (SIMS). The oxide semiconductor layer 102 which is highly purified by sufficient reduction in hydrogen concentration and is reduced in defect level in energy gap due to oxygen deficiency by sufficient supply of oxygen has a carrier concentration of less than $1 \times 10^{12}$/cm$^3$, desirably less than $1 \times 10^{11}$/cm$^3$, more desirably less than $1.45 \times 10^{10}$/cm$^3$. For example, the off-state current (here, a current per micrometer (μm) of channel width) at room temperature (25° C.) is lower than or equal to 100 zA (1 zA (zeptoampere) is $1 \times 10^{-21}$ A), desirably lower than or equal to 10 zA. In this manner, by using an i-type (intrinsic) or substantially i-type oxide semiconductor, the transistor having favorable electrical characteristics can be obtained.

Hereinafter, a method for manufacturing a semiconductor device, which is different from the method for manufacturing a semiconductor device in FIGS. 1A to 1D, FIGS. 2A and 2B, and FIGS. 3A and 3B, will be described with reference to FIGS. 4A and 4B, FIGS. 5A and 5B, and FIGS. 6A to 6C. Note that in FIGS. 4A and 4B, FIGS. 5A and 5B, and FIGS. 6A to 6C, portions corresponding to those in FIGS. 1A to 1D, FIGS. 2A and 2B, and FIGS. 3A and 3B are denoted by the same reference signs, and specific description thereof will be omitted.

In the method for manufacturing a semiconductor device in FIGS. 1A to 1D, FIGS. 2A and 2B, and FIGS. 3A and 3B, the source electrode 104a and the drain electrode 104b are formed on and in direct contact with the oxide semiconductor layer 102; however, one embodiment of the disclosed invention is not limited thereto.

Figure 4A:
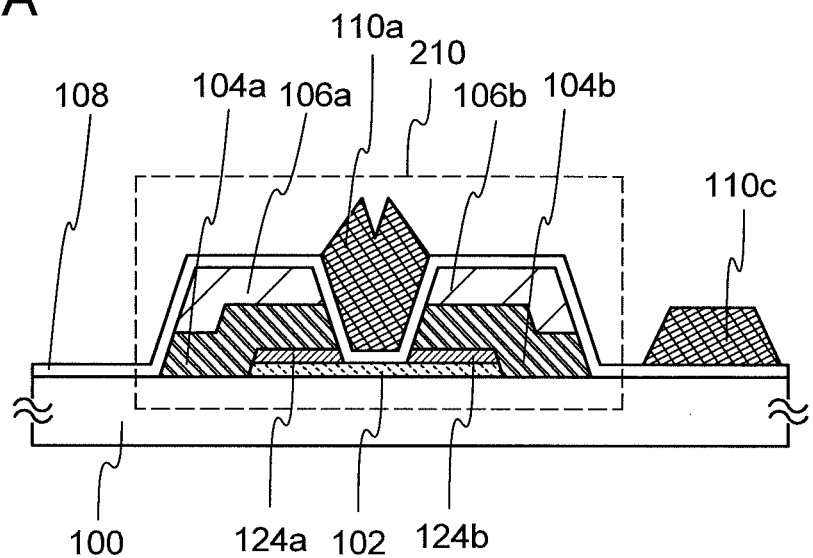
FIGS. 4A and 4B are cross-sectional views of semiconductor devices.

For example, as illustrated in FIG. 4A, a transistor 210 may be manufactured in which an n$^+$ layer 124a and an n$^+$ layer 124b are formed over the top surface of the oxide semiconductor layer 102, and the source electrode 104a and the drain electrode 104b are formed over the n$^+$ layer 124a and the n$^+$ layer 124b, respectively. Here, the n$^+$ layer 124a and the n$^+$ layer 124b function to reduce contact resistance between the oxide semiconductor layer 102 and the source electrode 104a and contact resistance between the oxide semiconductor layer 102 and the drain electrode 104b, respectively. The n$^+$ layer 124a and the n$^+$ layer 124b can be formed using an In—Zn—O-based material, an In—Sn—O-based material, an In—O-based material, or a Sn—O-based material. Further, the above material may contain SiO$_2$. The thicknesses of the n$^+$ layer 124a and the n$^+$ layer 124b are each preferably greater than or equal to 1 nm and less than or equal to 10 nm; in this embodiment, the n$^+$ layer 124a and the n$^+$ layer 124b each having a thickness of 5 nm are used.

In the case of the transistor 210 described above, a film functioning as an oxide semiconductor layer and a film functioning as an n$^+$ layer are successively formed and then processed at the same time to form the oxide semiconductor layer 102 and a film functioning as an island-shaped n$^+$ layer in the manufacturing process of the transistor 200. Further, in forming the source electrode 104a and the drain electrode 104b, the film functioning as an island-shaped n$^+$ layer is processed to form the n$^+$ layer 124a and the n$^+$ layer 124b. Note that after formation of the source electrode 104a and the drain electrode 104b, the same steps as those in FIGS. 1A to 1D, FIGS. 2A and 2B, and FIGS. 3A and 3B are performed, so that the transistor 210 can be manufactured.

Figure 4B:
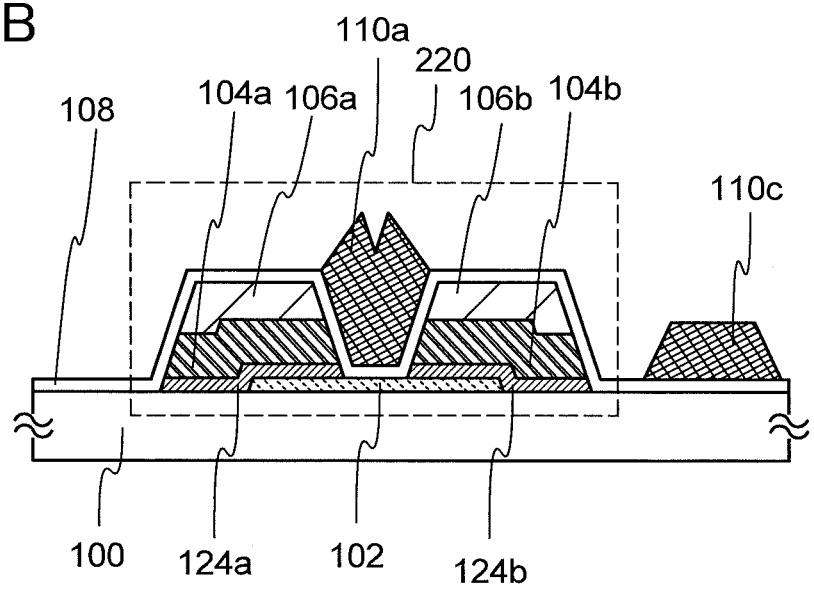

In the transistor 210 in FIG. 4A, the n$^+$ layer 124a and the n$^+$ layer 124b are formed only over the top surface of the oxide semiconductor layer 102; however, one embodiment of the disclosed invention is not limited thereto. As illustrated in FIG. 4B, a transistor 220 may be manufactured in which the n$^+$ layer 124a and the n$^+$ layer 124b further cover side surfaces of the oxide semiconductor layer 102. In that case, unlike in the method for manufacturing the transistor 210, after the island-shaped oxide semiconductor layer 102 is formed, a film functioning as an n$^+$ layer and a conductive film functioning as the source electrode 104a and the drain electrode 104b are successively formed. Then, these films are processed at the same time into island shapes to form the source electrode 104a, the drain electrode 104b, the n⁺ layer 124a, and the n⁺ layer 124b. Note that after formation of the source electrode 104a and the drain electrode 104b, the same steps as those in FIGS. 1A to 1D, FIGS. 2A and 2B, and FIGS. 3A and 3B are performed, so that the transistor 220 can be manufactured.

When the n⁺ layer 124a and the n⁺ layer 124b are thus formed between the oxide semiconductor layer 102 and the source and drain electrode layers 104a and 104b, the contact resistance therebetween can be lower than the contact resistance between the oxide semiconductor layer 102 and the source electrode 104a and the contact resistance between the oxide semiconductor layer 102 and the drain electrode 104b. By forming the n⁺ layer 124a and the n⁺ layer 124b, parasitic capacitance can be reduced and further, the amount of change in on-state current between before and after application of negative gate stress can be reduced (Ion deterioration can be suppressed) when bias-temperature stress test (BT test) is performed.

In the method for manufacturing a semiconductor device in FIGS. 1A to 1D, FIGS. 2A and 2B, and FIGS. 3A and 3B, the transistor 200 is formed such that the source electrode 104a and the drain electrode 104b are formed in contact with parts of the top surface of the oxide semiconductor layer 102; however, one embodiment of the disclosed invention is not limited thereto.

Figure 5A:
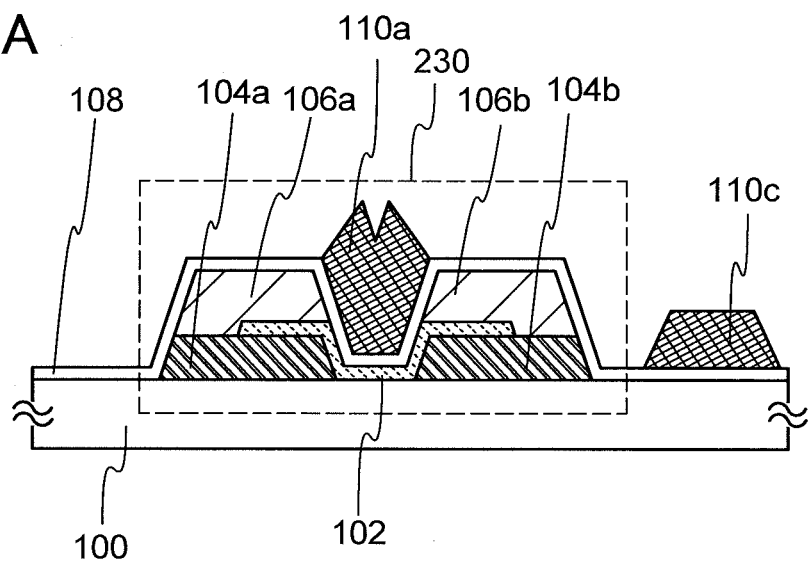
FIGS. 5A and 5B are cross-sectional views of semiconductor devices.

For example, as illustrated in FIG. 5A, a transistor 230 may be manufactured in which the oxide semiconductor layer 102 is in contact with parts of the top surfaces of the source electrode 104a and the drain electrode 104b. In that case, unlike in the method for manufacturing the transistor 200, the source electrode 104a and the drain electrode 104b are formed over the substrate 100 having an insulating surface and then, the oxide semiconductor layer 102 is formed in contact with the parts of the top surfaces of the source electrode 104a and the drain electrode 104b. After that, the insulating layer 106a and the insulating layer 106b are formed over the source electrode 104a and the drain electrode 104b, respectively. Here, the oxide semiconductor layer 102, the source electrode 104a, the drain electrode 104b, the insulating layer 106a, and the insulating layer 106b can be formed by a method similar to the method illustrated in FIGS. 1A to 1D, FIGS. 2A and 2B, and FIGS. 3A and 3B. Note that after formation of the insulating layer 106a and the insulating layer 106b, the same steps as those in FIGS. 1A to 1D, FIGS. 2A and 2B, and FIGS. 3A and 3B are performed, so that the transistor 230 can be manufactured.

Figure 5B:
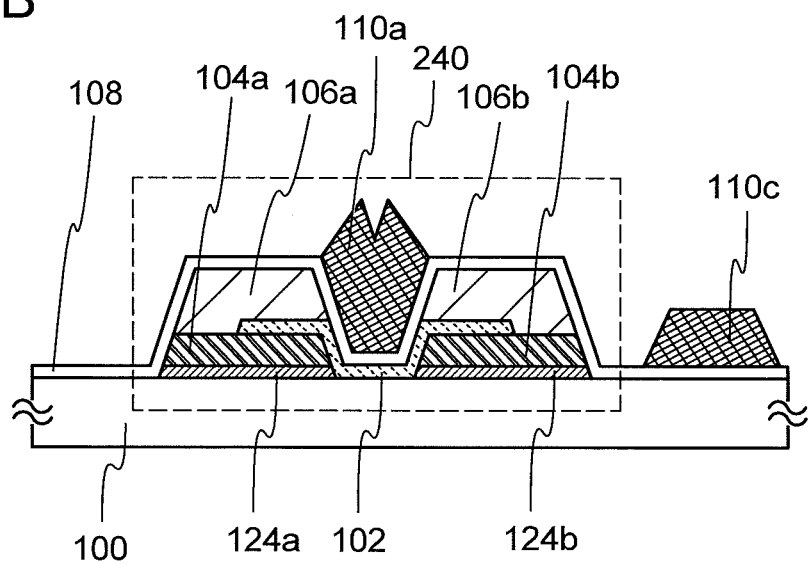

Further, as illustrated in FIG. 5B, a transistor 240 may be manufactured, which is different from the transistor 230 in that the n⁺ layer 124a and the n⁺ layer 124b are provided below the source electrode 104a and the drain electrode 104b, respectively. In the transistor 240, side surfaces of the n⁺ layer 124a and the n⁺ layer 124b are in contact with the oxide semiconductor layer 102; therefore, the contact resistance therebetween can be lower than the contact resistance between the oxide semiconductor layer 102 and the source electrode 104a and the contact resistance between the oxide semiconductor layer 102 and the drain electrode 104b.

Further, examples of a structure and a manufacturing method of the oxide semiconductor layer 102, which are different from those illustrated in FIGS. 1A to 1D, FIGS. 2A and 2B, and FIGS. 3A and 3B, will be described with reference to FIGS. 6A to 6C.

First, a first oxide semiconductor layer is formed to a thickness of 1 nm or more and 10 nm or less over the substrate 100 having an insulating surface. Note that a base insulating layer is preferably formed over the substrate 100 before the first oxide semiconductor layer is formed. The base insulating layer can be formed using a material and a method similar to those of the gate insulating layer 108.

Figure 6A:
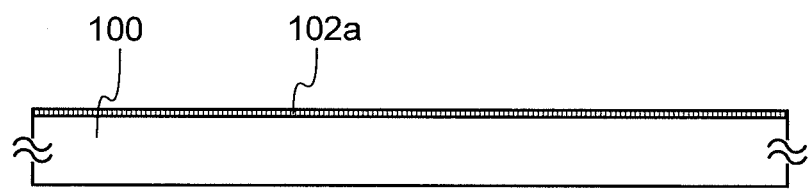
FIGS. 6A to 6C are cross-sectional views relating to manufacturing steps of a semiconductor device.
Figure 6B:
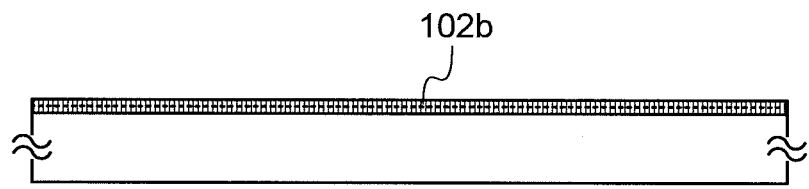
Figure 6C:
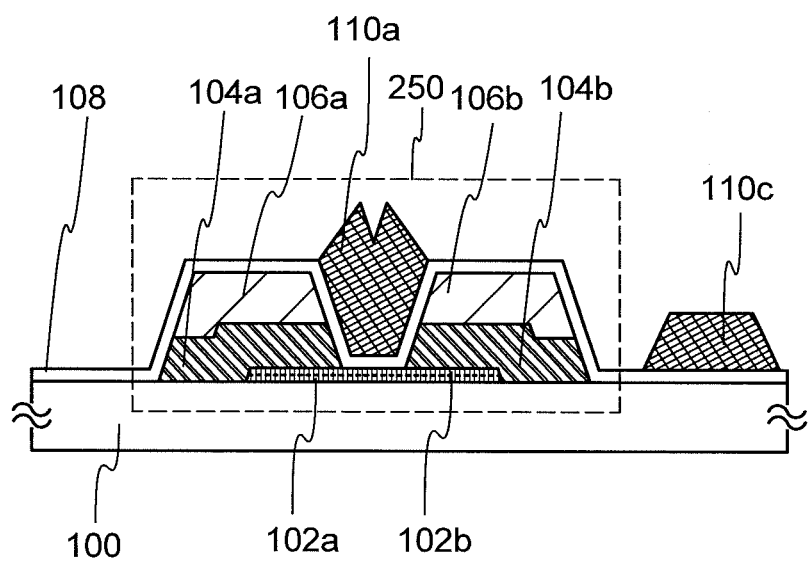

In the method for manufacturing a semiconductor device, which is illustrated in FIGS. 6A to 6C, the first oxide semiconductor layer is formed to a thickness of 5 nm in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at a ratio of 1:1:2 [molar ratio]) is used; the distance between the substrate and the target is 170 mm; the substrate temperature is 400° C.; the pressure is 0.4 Pa; and the direct current (DC) power is 0.5 kW.

Then, first heat treatment is performed with the substrate placed in an atmosphere of nitrogen or dry air. The first heat treatment is performed at a temperature higher than or equal to 450° C. and lower than the strain point of the substrate, preferably higher than or equal to 400° C. and lower than or equal to 650° C. Through the first heat treatment, a first crystalline oxide semiconductor layer 102a is formed (see FIG. 6A).

Next, a second oxide semiconductor layer is formed to a thickness greater than 10 nm over the first crystalline oxide semiconductor layer 102a.

In this embodiment, the second oxide semiconductor layer is formed to a thickness of 25 nm in an oxygen atmosphere, an argon atmosphere, or a mixed atmosphere of argon and oxygen under the following conditions: a target for an oxide semiconductor (a target for an In—Ga—Zn—O-based oxide semiconductor containing $In_2O_3$, $Ga_2O_3$, and ZnO at a ratio of 1:1:2 [molar ratio]) is used; the distance between the substrate and the target is 170 mm; the substrate temperature is 400° C.; the pressure is 0.4 Pa; and the direct current (DC) power is 0.5 kW.

Then, second heat treatment is performed with the substrate placed in an atmosphere of nitrogen or dry air. The second heat treatment is performed at a temperature higher than or equal to 450° C. and lower than the strain point of the substrate, preferably higher than or equal to 400° C. and lower than or equal to 650° C. Through the second heat treatment, a second crystalline oxide semiconductor layer 102b is formed (see FIG. 6B).

When the first heat treatment and the second heat treatment are performed at a temperature higher than 650° C., the oxide semiconductor layer is likely to crack (in a thickness direction) due to shrink of a glass substrate. Therefore, by setting the temperatures of the first heat treatment and the second heat treatment and the substrate temperature in deposition by sputtering to a temperature lower than or equal to 650° C., the transistor which is highly reliable can be formed over a large glass substrate.

A transistor 250 can be manufactured using the oxide semiconductor layer in which the second crystalline oxide semiconductor layer 102b is stacked over the first crystalline oxide semiconductor layer 102a, which is formed as described above, by a method similar to that in FIGS. 1A to 1D, FIGS. 2A and 2B, and FIGS. 3A and 3B (see FIG. 6C).

In the transistor 250 in FIG. 6C, the first crystalline oxide semiconductor layer 102a and the second crystalline oxide semiconductor layer 102b have c-axis alignment perpendicular to a surface of a crystal layer obtained by being at least partly crystallized. Thus, the transistor 250 can be highly reliable.

In addition, in the structure of FIG. 6C, the stack of the oxide semiconductors of the transistor 250 is favorably ordered in a direction along an interface with the gate insulating layer. In the case where carriers flow along the interface, the stack of the oxide semiconductors is in a state similar to a floating state where a bias is not directly applied to the stack of the oxide semiconductors. Thus, degradation of transistor characteristics can be suppressed or reduced even when light irradiation is performed or BT stress is applied.

The structures, the methods, and the like described above can be combined as appropriate.

Even in the case of the transistor miniaturized as described above, by forming the gate electrode 110*a* in a self-aligned manner, the gate electrode 110*a* can be formed precisely and easily in the region which is over the oxide semiconductor layer 102 and sandwiched between the source electrode 104*a* and the drain electrode 104*b*. Further, it is possible to reduce overlap between the gate electrode 110*a* and the source and drain electrodes 104*a* and 104*b*, which leads to suppression of an increase in parasitic capacitance between the gate electrode 110*a* and the source and drain electrodes 104*a* and 104*b*. Thus, defects due to miniaturization are suppressed, and a transistor having desired transistor characteristics as designed can be manufactured.

As described above, according to one embodiment of the disclosed invention, a problem due to miniaturization can be solved. As a result, the size of a transistor can be sufficiently reduced. When the size of the transistor is sufficiently reduced, an area occupied by the semiconductor device is also reduced, which leads to an increase in the number of semiconductor devices manufactured from one substrate. Accordingly, the manufacturing cost of the semiconductor device can be reduced. Further, since the semiconductor device is downsized, a semiconductor device which is substantially the same as a conventional semiconductor device in size and has a further improved function can be realized. Furthermore, effects of high-speed operation, low power consumption, and the like of a transistor can be obtained in accordance with a reduction in channel length. Thus, miniaturization of a transistor including an oxide semiconductor can be achieved according to one embodiment of the disclosed invention, and various effects accompanied with the miniaturization can be obtained.

The structures, the methods, and the like described in this embodiment can be combined as appropriate with any of the structures and the methods described in the other embodiments.

Embodiment 2

In this embodiment, a manufacturing method of a semiconductor device, according to another embodiment of the disclosed invention, which is different from those of Embodiment 1, will be described with reference to FIGS. 7A to 7D. Note that in FIGS. 7A to 7D, portions corresponding to those in FIGS. 1A to 1D, FIGS. 2A and 2B, and FIGS. 3A and 3B are denoted by the same reference signs, and specific description thereof will be omitted.

FIGS. 7A to 7D are cross-sectional views illustrating manufacturing steps of a transistor 300 as an example of a method for manufacturing a semiconductor device according to one embodiment of the disclosed invention. Here, the transistor 300 in FIG. 7D includes, over the substrate 100, an oxide semiconductor layer 102, a source electrode 104*a*, a drain electrode 104*b*, an insulating layer 106*a*, an insulating layer 106*b*, a gate insulating layer 108, and a gate electrode 120*a*. In addition, a wiring 120*c* including the same material as the gate electrode 120*a* is formed over the gate insulating layer 108.

Here, the channel length L of the transistor 300 is preferably greater than or equal to 10 nm and less than or equal to 200 nm, more preferably greater than or equal to 20 nm and less than or equal to 100 nm. Thus, the channel length L is made small in order to miniaturize the transistor, so that an increase in operation speed and a reduction in power consumption of the transistor can be achieved.

The gate electrode 120*a* provided over the gate insulating layer 108 overlaps with at least part of a region which is over the oxide semiconductor layer 102 and sandwiched between the source electrode 104*a* and the drain electrode 104*b*. Further, the gate electrode 120*a* is provided so that the top surface thereof is at a level lower than that of the uppermost surface of the gate insulating layer 108. With such a structure, the gate electrode 120*a* can be precisely formed in the region which is over the oxide semiconductor layer 102 and sandwiched between the source electrode 104*a* and the drain electrode 104*b*, and an increase in parasitic capacitance can be suppressed. Therefore, the transistor 300 can have desired transistor characteristics as designed.

An example of a manufacturing process of the transistor 300 in FIG. 7D will be described below with reference to FIGS. 7A to 7D.

First, the oxide semiconductor layer 102, the source electrode 104*a*, the drain electrode 104*b*, the insulating layer 106*a*, and the insulating layer 106*b* are formed by a method similar to the method for manufacturing a semiconductor device, which is illustrated in FIG. 1A. As for details of the oxide semiconductor layer 102, the source electrode 104*a*, the drain electrode 104*b*, the insulating layer 106*a*, and the insulating layer 106*b*, description of the above embodiment can be referred to.

Figure 7A:
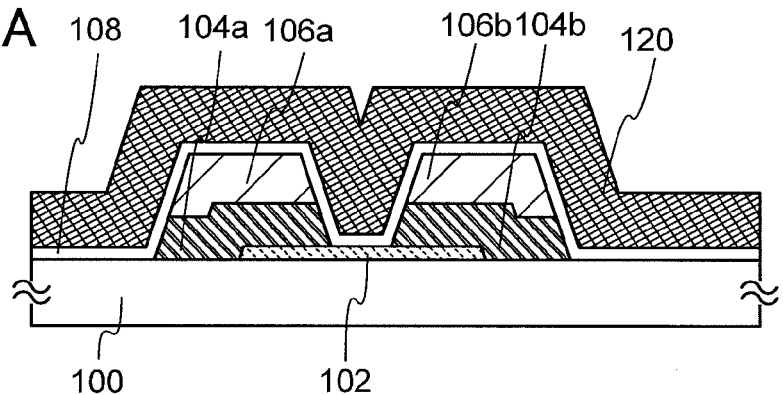
FIGS. 7A to 7D are cross-sectional views relating to manufacturing steps of a semiconductor device.
Figure 7B:
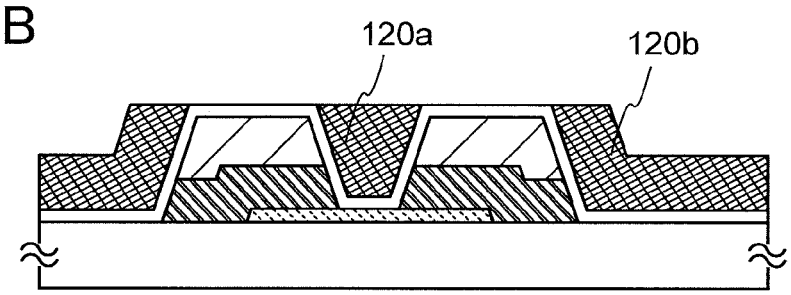

Then, the gate insulating layer 108 is formed and a conductive layer 120 is formed over the gate insulating layer 108 by a method similar to the method for manufacturing a semiconductor device, which is illustrated in FIG. 1B (see FIG. 7A). As for details of the gate insulating layer 108 and the conductive layer 120, description of the gate insulating layer 108 and the conductive layer 110 in the above embodiment can be referred to.

Next, the conductive layer 120 is processed so that at least part of a region of the gate insulating layer 108, which overlaps with the source electrode 104*a* or the drain electrode 104*b*, is exposed. Consequently, the gate electrode 120*a* overlapping with at least a region sandwiched between the source electrode 104*a* and the drain electrode 104*b* is formed in a self-aligned manner (see FIG. 7B). Here, a conductive layer 120*b* is left in formation of the gate electrode 120*a*.

The conductive layer 120 is processed by polishing treatment such as CMP treatment, whereby a region of the conductive layer 120, which overlaps with the source electrode 104*a* or the drain electrode 104*b*, can be removed at an even rate from the top surface thereof. When the removal is performed so that the uppermost surface of the gate insulating layer 108 is exposed (or when a small portion of the gate insulating layer 108 is removed after the uppermost surface of the gate insulating layer 108 is exposed), this operation is stopped. Thus, the gate electrode 120*a* and the conductive layer 120*b* can be formed so that the uppermost surface of the gate insulating layer 108 is exposed. Conditions of the CMP treatment may be set as appropriate depending on the material of the conductive layer 120.

When a region of the conductive layer 120, which is sandwiched between the source electrode 104a and the drain electrode 104b, is sufficiently thick, the gate electrode 120a may be formed in such a manner that the conductive layer 120 is etched until the uppermost surface of the gate insulating layer 108 is exposed. In that case, the top surface of the gate electrode 120a is etched and thus has a recessed portion in some cases. Further, in FIG. 7B, a portion corresponding to the conductive layer 120b is etched at the same time; therefore, the conductive layer 120b is not formed in some cases. Note that either wet etching or dry etching may be employed for the etching of the conductive layer 120. The etching conditions (e.g., an etching gas or an etching solution, etching time, and temperature) are set as appropriate depending on the material so that the conductive layer 120 can be etched to have a desired shape. In particular, the etching conditions are set so that the etching selectivity of the conductive layer 120 to the gate insulating layer 108 is sufficiently high.

Figure 7C:
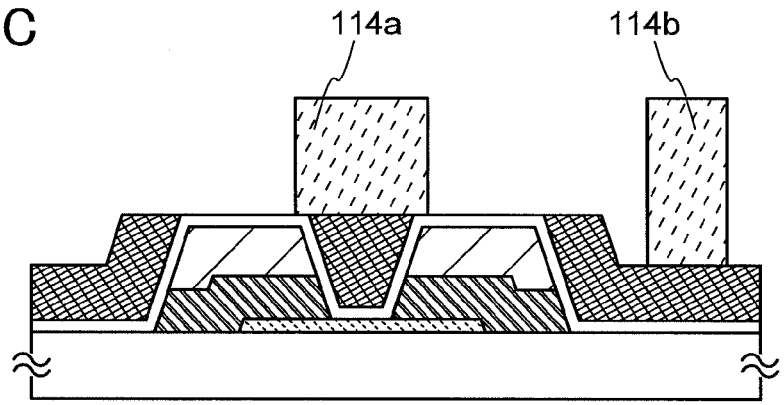

Next, the resist mask 114a is formed so as to cover the gate electrode 120a, and the resist mask 114b is formed over part of the conductive layer 120b (see FIG. 7C). After that, the conductive layer 120b is processed using the resist mask 114a and the resist mask 114b to form the wiring 120c (see FIG. 7D).

As for details of the resist mask 114a and the resist mask 114b, description of the above embodiment can be referred to.

The wiring 120c can be Ruined by performing etching by a method similar to that of the wiring 110c which is described in the above embodiment. Thus, the wiring 120c can be formed utilizing part of the conductive layer 120b left when the gate electrode 120a is formed, so that the cost of a semiconductor device can be reduced.

Figure 7D:
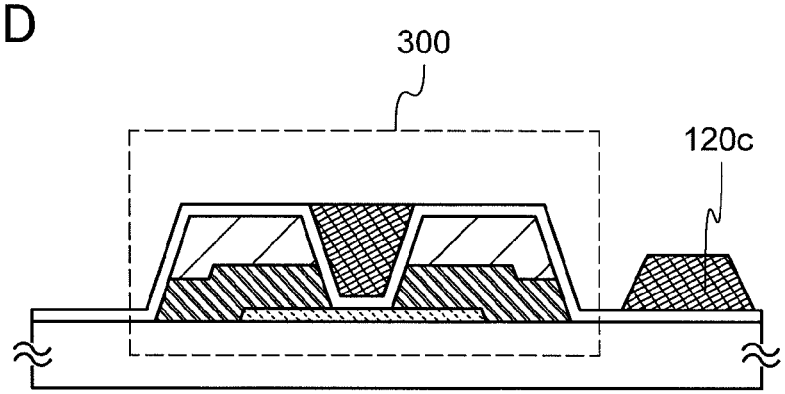

Through the above process, the transistor 300 can be manufactured in which the gate electrode 120a overlaps with a region which is over the oxide semiconductor layer 102 and sandwiched between the source electrode 104a and the drain electrode 104b, while miniaturization thereof is achieved (see FIG. 7D).

Note that the method for manufacturing a semiconductor device, which is described in this embodiment, can be combined as appropriate with any of the manufacturing methods of semiconductor devices, which are illustrated in FIGS. 4A and 4B, FIGS. 5A and 5B, and FIGS. 6A to 6C.

Even in the case of the transistor miniaturized as described above, by forming the gate electrode 120a in a self-aligned manner, the gate electrode 120a can be formed precisely and easily in the region which is over the oxide semiconductor layer 102 and sandwiched between the source electrode 104a and the drain electrode 104b. Further, it is possible to prevent the gate electrode 120a from overlapping with the source electrode 104a and the drain electrode 104b, which leads to suppression of an increase in parasitic capacitance between the gate electrode 120a and the source and drain electrodes 104a and 104b. Thus, defects due to miniaturization are suppressed, and a transistor having desired transistor characteristics as designed can be manufactured.

As described above, according to one embodiment of the disclosed invention, a problem due to miniaturization can be solved. As a result, the size of a transistor can be sufficiently reduced. When the size of the transistor is sufficiently reduced, an area occupied by the semiconductor device is also reduced, which leads to an increase in the number of semiconductor devices manufactured from one substrate. Accordingly, the manufacturing cost of the semiconductor device can be reduced. Further, since the semiconductor device is downsized, the semiconductor device which is substantially the same in size with further increased function can be realized. Furthermore, effects of high-speed operation, low power consumption, and the like of a transistor can be obtained in accordance with a reduction in channel length. Thus, miniaturization of a transistor including an oxide semiconductor can be achieved according to one embodiment of the disclosed invention, and various effects accompanied with the miniaturization can be obtained.

The structures, the methods, and the like described in this embodiment can be combined as appropriate with any of the structures and the methods described in the other embodiments.

Embodiment 3

In this embodiment, as an example of a semiconductor device formed by the method for manufacturing a semiconductor device, which is described in the above embodiment, a storage medium (a memory element) will be described. In this embodiment, the transistor including an oxide semiconductor, which is manufactured by the method for manufacturing a semiconductor device, which is described in the forgoing embodiment, and a transistor including a material other than an oxide semiconductor are formed over one substrate.

Figure 8A:
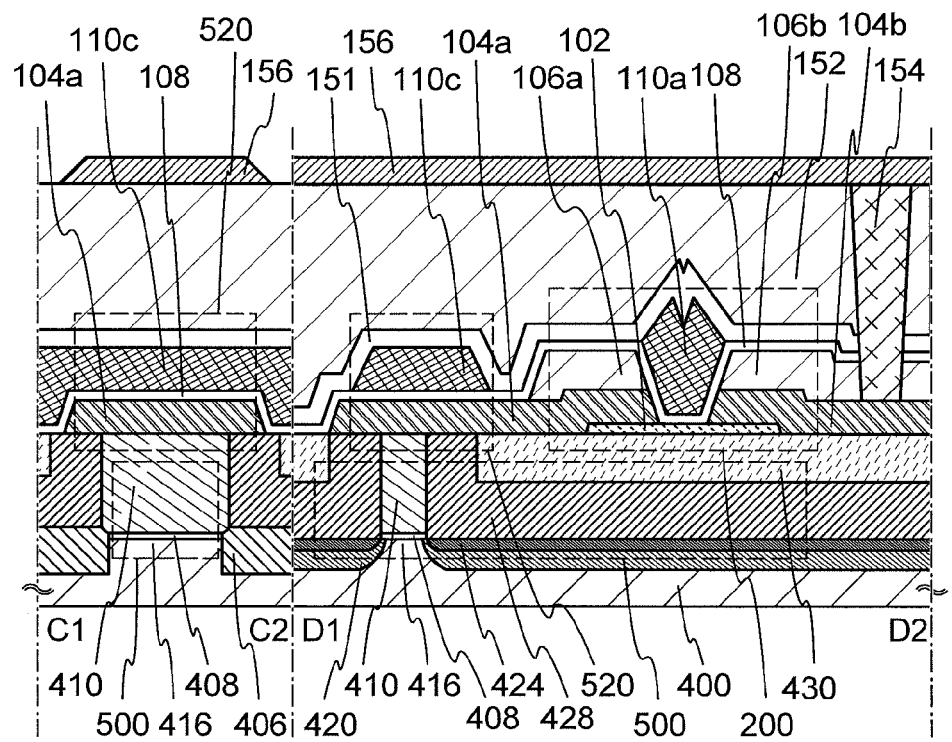
FIGS. 8A, 8B, and 8C are a cross-sectional view, a top view, and a circuit diagram of a semiconductor device, respectively.
Figure 8B:
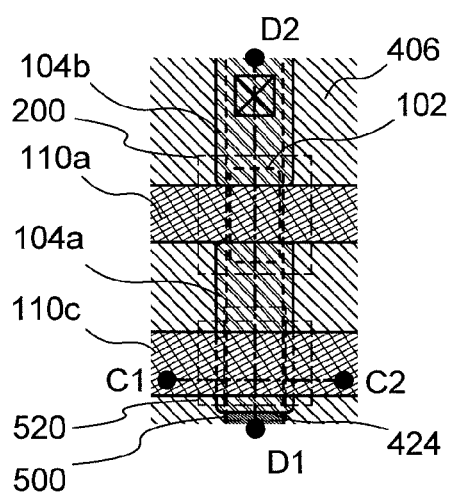
Figure 8C:
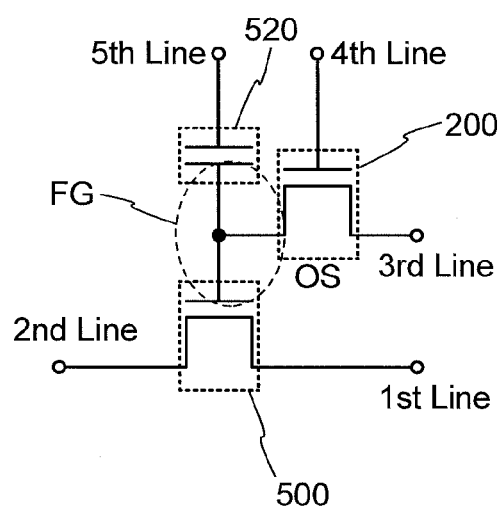

FIGS. 8A to 8C illustrate an example of a structure of a semiconductor device. FIG. 8A illustrates a cross section of the semiconductor device, and FIG. 8B is a plan view of the semiconductor device. Here, FIG. 8A corresponds to a cross section along C1-C2 and D1-D2 in FIG. 8B. In addition, FIG. 8C illustrates an example of a diagram of a circuit using the semiconductor device as a memory element. In the semiconductor device illustrated in FIGS. 8A and 8B, a transistor 500 including a first semiconductor material is provided in a lower portion, and the transistor 200 described in the above embodiment is provided in an upper portion. Note that the transistor 200 includes an oxide semiconductor as a second semiconductor material. In this embodiment, the first semiconductor material is a semiconductor material other than an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material other than an oxide semiconductor can operate at high speed easily. On the other hand, a transistor including an oxide semiconductor can hold charge for a long time owing to its characteristics.

In this embodiment, an example in which a storage medium includes the transistor 200 is described; it is needless to say that the transistor 210, the transistor 220, the transistor 230, the transistor 240, the transistor 250, the transistor 300, or the like can be used instead of the transistor 200.

The transistor 500 in FIGS. 8A to 8C includes a channel formation region 416 provided in a substrate 400 including a semiconductor material (e.g., silicon); impurity regions 420 provided so that the channel formation region 416 is sandwiched therebetween; metal compound regions 424 in contact with the impurity regions 420; a gate insulating layer 408 provided over the channel formation region 416; and a gate electrode 410 provided over the gate insulating layer 408.

As the substrate 400 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film including a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating layer provided therebetween.

An element isolation insulating layer 406 is provided over the substrate 400 so as to surround the transistor 500. An insulating layer 428 and an insulating layer 430 are provided so as to cover the transistor 500. Note that it is desirable that the transistor 500 be not provided with a sidewall insulating layer as illustrated in FIGS. 8A and 8B to realize higher integration. On the other hand, in the case where the characteristics of the transistor 500 have priority, sidewall insulating layers may be provided on side surfaces of a gate electrode 410, and the impurity regions 420 including regions with different impurity concentrations may be provided.

The transistor 500 can be manufactured using silicon, germanium, silicon germanium, silicon carbide, gallium arsenide, or the like. The transistor 500 can operate at high speed. Thus, when the transistor is used as a reading transistor, data can be read at high speed.

After the transistor 500 is formed, for treatment prior to the formation of the transistor 200 and a capacitor 520, the insulating layer 428 and the insulating layer 430 are subjected to CMP treatment so that the top surface of the gate electrode 410 is exposed. Although, it is possible to employ etching treatment or the like other than CMP treatment as the treatment for exposing the top surface of the gate electrode 410, it is preferable to planarize the surfaces of the insulating layer 428 and the insulating layer 430 as much as possible in order to improve characteristics of the transistor 200.

As described in the above embodiment, the transistor 200 includes the oxide semiconductor layer 102, the source electrode 104a, the drain electrode 104b, the insulating layer 106a, the insulating layer 106b, the gate insulating layer 108, and the gate electrode 110a. As for details, description in Embodiment 1 can be referred to. A transistor in an upper portion, which is typified by the transistor 200, can be manufactured by the method described in Embodiment 1 or 2.

Here, the source electrode 104a is provided in contact with the gate electrode 410; thus, the gate electrode 410 of the transistor 500 and the source electrode 104a of the transistor 200 are connected to each other.

Further, the wiring 110c described in the above embodiment is provided over the source electrode 104a with the gate insulating layer 108 provided therebetween, whereby the capacitor 520 can be formed. In the case where a capacitor is not needed, it is possible to employ a structure without the capacitor 520.

Then, an insulating layer 151 and an insulating layer 152 are formed over the gate insulating layer 108, the gate electrode 110a, and the wiring 110c. The insulating layer 151 and the insulating layer 152 can be formed by a sputtering method, a CVD method, or the like. The insulating layer 151 and the insulating layer 152 can be formed using a material including an inorganic insulating material such as silicon oxide, silicon oxynitride, silicon nitride, hafnium oxide, aluminum oxide, or gallium oxide.

A wiring 156 is formed over the insulating layer 152. The wiring 156 is electrically connected to the drain electrode 104b through an electrode 154 formed in an opening formed in the insulating layer 106b, the gate insulating layer 108, the insulating layer 151, and the insulating layer 152.

The electrode 154 can be formed in such a manner, for example, that a conductive film is formed in a region including the opening by a PVD method, a CVD method, or the like and then part of the conductive film is removed by etching, CMP, or the like.

The wiring 156 can be formed in such a manner, for example, that a conductive layer is formed by a PVD method such as a sputtering method, or a CVD method such as a plasma CVD method, and then patterned. The wiring 156 can be formed using a material and a method similar to those of the source electrode 104a and the drain electrode 104b.

FIG. 8C illustrates an example of a diagram of a circuit using the semiconductor device as a memory element. In FIG. 8C, one of a source electrode and drain electrode of the transistor 200, one electrode of the capacitor 520, and a gate electrode of the transistor 500 are electrically connected to one another. A first wiring (a 1st line, also referred to as a source line) is electrically connected to a source electrode of the transistor 500. A second wiring (a 2nd line, also referred to as a bit line) is electrically connected to a drain electrode of the transistor 500. A third wiring (a 3rd line, also referred to as a first signal line) is electrically connected to the other of the source electrode and the drain electrode of the transistor 200. A fourth wiring (a 4th line, also referred to as a second signal line) is electrically connected to a gate electrode of the transistor 200. A fifth wiring (a 5th line, also referred to as a word line) is electrically connected to the other electrode of the capacitor 520.

The transistor 200 including an oxide semiconductor has an extremely low off-state current; therefore, when the transistor 200 is off, the potential of a node (hereinafter, a node FG) where one of the source electrode and drain electrode of the transistor 200, one electrode of the capacitor 520, and the gate electrode of the transistor 500 are electrically connected to one another can be held for an extremely long time. Provision of the capacitor 520 facilitates holding of charge given to the node FG and reading of stored data.

When data is stored in the semiconductor device (writing), first, the potential of the fourth wiring is set to a potential at which the transistor 200 is turned on, whereby the transistor 200 is turned on. Thus, the potential of the third wiring is supplied to the node FG and a predetermined amount of charge is accumulated in the node FG. Here, charge for supplying either of two different potential levels (hereinafter referred to as a low-level charge and a high-level charge) is given to the node FG. After that, the potential of the fourth wiring is set to a potential at which the transistor 200 is turned off, whereby the transistor 200 is turned off. Thus, the node FG comes to be in a floating state and the predetermined amount of charge is held in the node FG. The predetermined amount of charge is thus accumulated and held in the node FG, whereby a memory cell can store data.

Since the off-state current of the transistor 200 is extremely small, the charge supplied to the node FG is held for a long time. Therefore, power consumption can be considerably reduced because refresh operation becomes unnecessary or the frequency of refresh operation can be extremely low. Moreover, stored data can be stored for a long time even when power is not supplied.

When stored data is read out (in reading data), while a predetermined potential (a fixed potential) is supplied to the first wiring, an appropriate potential (a read-out potential) is supplied to the fifth wiring, whereby the transistor 500 changes its state depending on the amount of charge held in the node FG. This is because, in general, when the transistor 500 is an n-channel transistor, an apparent threshold voltage $V_{th\_H}$ of the transistor 500 in the case where a high-level charge is held in the node FG is lower than an apparent threshold voltage $V_{th\_L}$ of the transistor 500 in the case where a low-level charge is held in the node FG Here, an apparent threshold voltage refers to the potential of the fifth wiring, which is needed to turn on the transistor 500. Thus, by setting the potential of the fifth wiring to a potential $V_0$ which is between $V_{th\_H}$ and $V_{th\_L}$, charge held in the node FG can be determined. For example, in the case where a high-level charge is applied in writing, the transistor 500 is turned on when the potential of the fifth wiring is set to $V_0$ ($>V_{th\_H}$). In the case where a low-level charge is given in writing, even when the potential of the fifth wiring is set to $V_0$ ($V_{th\_L}$), the transistor 500 remains in an off state. In such a manner, by controlling the potential of the fifth wiring and determining whether the transistor 500 is on or off (reading out the potential of the second wiring), stored data can be read out.

Further, in order to rewrite stored data, a new potential is supplied to the node FG that is holding the predetermined amount of charge given in the above writing, so that charge of the new data is held in the node FG. Specifically, the potential of the fourth wiring is set to a potential at which the transistor 200 is turned on, whereby the transistor 200 is turned on. Thus, the potential of the third wiring (a potential of new data) is supplied to the node FG, and the predetermined amount of charge is accumulated in the node FG. After that, the potential of the fourth wiring is set to a potential at which the transistor 200 is turned off, whereby the transistor 200 is turned off. Thus, charge of the new data is held in the node FG. In other words, while the predetermined amount of charge given in first writing is held in the node FG, the same operation (second writing) as that in the first writing is performed, whereby the stored data can be overwritten.

The off-state current of the transistor 200 described in this embodiment can be sufficiently reduced by using the oxide semiconductor layer 102 which has been highly purified to be intrinsic. In addition, the oxide semiconductor layer 102 contains excessive oxygen, whereby variation in the electrical characteristics of the transistor 200 is suppressed, so that the transistor can be electrically stable. Further, with the use of such a transistor, a highly reliable semiconductor device capable of holding stored data for an extremely long time can be obtained.

Moreover, by forming the gate electrode 110*a* in a self-aligned manner, the gate electrode 110*a* can be formed precisely and easily in the region which is over the oxide semiconductor layer 102 and sandwiched between the source electrode 104*a* and the drain electrode 104*b*. Further, it is possible to prevent the gate electrode 110*a* from overlapping with the source electrode 104*a* and the drain electrode 104*b*, which leads to suppression of an increase in parasitic capacitance between the gate electrode 110*a* and the source and drain electrodes 104*a* and 104*b*. Thus, defects due to miniaturization are suppressed, and a transistor having desired transistor characteristics as designed can be manufactured.

As described above, in the case of the semiconductor device described in this embodiment, problems accompanied with miniaturization can be solved. Accordingly, the size of the transistor can be sufficiently reduced and thus the integration degree of the semiconductor device can be sufficiently high.

In the semiconductor device described in this embodiment, the transistor 500 and the transistor 200 overlap with each other; therefore, the integration degree of the semiconductor device can be sufficiently high.

The structures, the methods, and the like described in this embodiment can be combined as appropriate with any of the structures and the methods described in the other embodiments.

Embodiment 4

In this embodiment, an example of application of a semiconductor device according to one embodiment of the disclosed invention will be described with reference to FIGS. 9A and 9B.

Figure 9A:
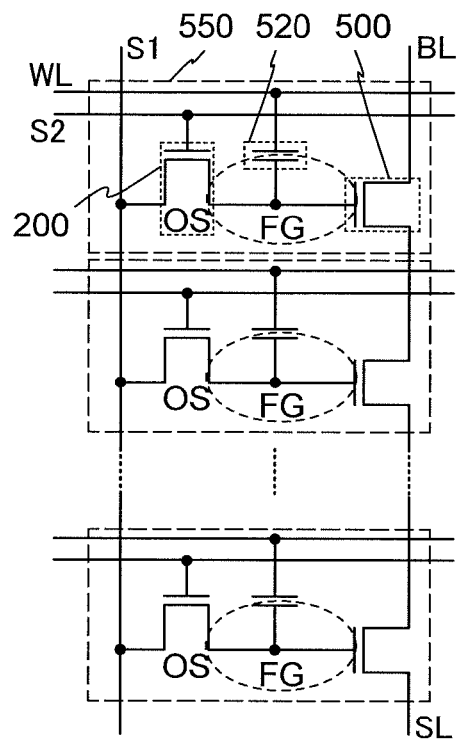
FIGS. 9A and 9B are circuit diagrams of semiconductor devices.
Figure 9B:
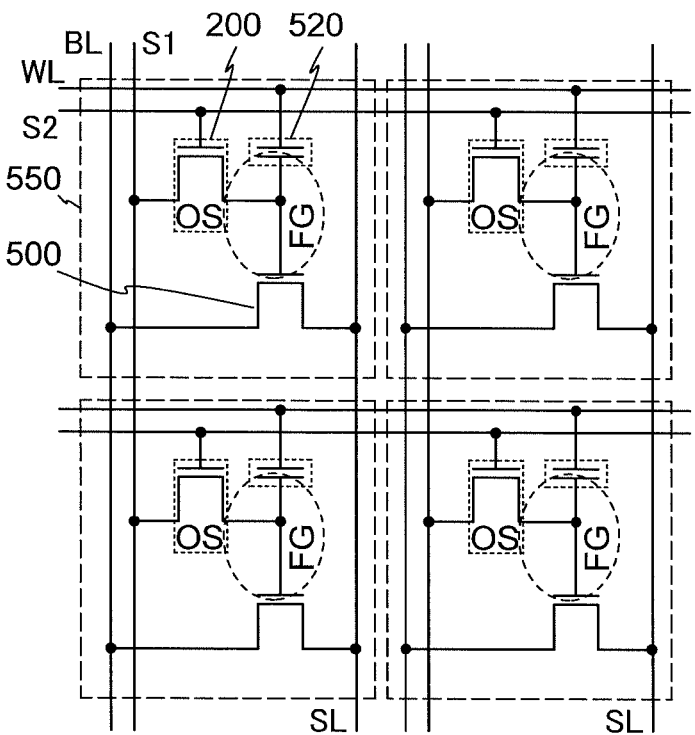

FIGS. 9A and 9B are circuit diagrams of semiconductor devices each including a plurality of semiconductor devices (hereinafter also referred to as memory cells 550) illustrated in FIGS. 8A to 8C. FIG. 9A is a circuit diagram of a so-called NAND semiconductor device in which the memory cells 550 are connected in series, and FIG. 9B is a circuit diagram of a so-called NOR semiconductor device in which the memory cells 550 are connected in parallel.

The semiconductor device in FIG. 9A includes a source line SL, a bit line BL, a first signal line S1, a plurality of second signal lines S2, a plurality of word lines WL, and the plurality of memory cells 550. In FIG. 9A, one source line SL and one bit line BL are provided in the semiconductor device; however, an embodiment of the disclosed invention is not limited to this. A plurality of source lines SL and a plurality of bit lines BL may be provided.

In each of the memory cells 550, a gate electrode of the transistor 500, one of a source electrode and a drain electrode of the transistor 200, and one of electrodes of the capacitor 520 are electrically connected to one another. The first signal line S1 and the other of the source electrode and the drain electrode of the transistor 200 are electrically connected to each other, and the second signal line S2 and a gate electrode of the transistor 200 are electrically connected to each other. The word line WL and the other of the electrodes of the capacitor 520 are electrically connected to each other.

Further, the source electrode of the transistor 500 included in the memory cell 550 is electrically connected to the drain electrode of the transistor 500 in the adjacent memory cell 550. The drain electrode of the transistor 500 included in the memory cell 550 is electrically connected to the source electrode of the transistor 500 in the adjacent memory cell 550. Note that the drain electrode of the transistor 500 included in the memory cell 550 of the plurality of memory cells connected in series, which is provided at one of ends, is electrically connected to the bit line BL. The source electrode of the transistor 500 included in the memory cell 550 of the plurality of memory cells connected in series, which is provided at the other end, is electrically connected to the source line SL.

In the semiconductor device in FIG. 9A, writing operation and reading operation are performed in each row. The writing operation is performed as follows. A potential at which the transistor 200 is turned on is supplied to the second signal line S2 of a row where writing is to be performed, so that the transistor 200 of the row where writing is to be performed is turned on. Accordingly, a potential of the first signal line S1 is supplied to the gate electrode of the transistor 500 of the specified row, so that predetermined charge is given to the gate electrode. Thus, data can be written to the memory cell of the specified row.

Further, the reading operation is performed as follows. First, a potential at which the transistor 500 is turned on regardless of charge given to the gate electrode thereof is supplied to the word lines WL of the rows other than the row where reading is to be performed, so that the transistors 500 of the rows other than the row where reading is to be performed are turned on. Then, a potential (reading potential) at which an on state or an off state of the transistor 500 is determined depending on charge in the gate electrode of the transistor 500 is supplied to the word line WL of the row where reading is to be performed. After that, a constant potential is supplied to the source line SL so that a reading circuit (not illustrated) connected to the bit line BL is operated. Here, the plurality of transistors 500 between the source line SL and the bit line BL are on except the transistors 500 of the row where reading is to be performed; therefore, conductance between the source line SL and the bit line BL is determined by a state (an on state or an off state) of the transistors 500 of the row where reading is to be performed. The conductance of the transistors 500 on which reading is performed depends on charge in the gate electrodes thereof. Thus, a potential of the bit line BL varies accordingly. By reading the potential of the bit line BL with the reading circuit, data can be read from the memory cells of the specified row.

The semiconductor device in FIG. 9B includes a plurality of source lines SL, a plurality of bit lines BL, a plurality of first signal lines S1, a plurality of second signal lines S2, a plurality of word lines WL, and a plurality of the memory cells 550. A gate electrode of the transistor 500, one of a source electrode and a drain electrode of the transistor 200, and one of electrodes of the capacitor 520 are electrically connected to one another. The source line SL and a source electrode of the transistor 500 are electrically connected to each other. The bit line BL and a drain electrode of the transistor 500 are electrically connected to each other. The first signal line S1 and the other of the source electrode and the drain electrode of the transistor 200 are electrically connected to each other, and the second signal line S2 and a gate electrode of the transistor 200 are electrically connected to each other. The word line WL and the other of the electrodes of the capacitor 520 are electrically connected to each other.

In the semiconductor device in FIG. 9B, writing operation and reading operation are performed in each row. The writing operation is performed in a manner similar to that of the semiconductor device in FIG. 9A. The reading operation is performed as follows. First, a potential at which the transistor 500 is turned off regardless of charge given to the gate electrode thereof is supplied to the word lines WL of the rows other than the row where reading is to be performed, so that the transistors 500 of the rows other than the row where reading is to be performed are turned off. Then, a potential (reading potential) at which an on state or an off state of the transistor 500 is determined depending on charge in the gate electrode thereof is supplied to the word line WL of the row where reading is to be performed. After that, a constant potential is supplied to the source lines SL so that a reading circuit (not illustrated) connected to the bit lines BL is operated. Here, conductance between the source lines SL and the bit lines BL is determined by a state (an on state or an off state) of the transistors 500 of the row where reading is to be performed. That is, a potential of the bit lines BL depends on charge in the gate electrodes of the transistors 500 of the row where reading is to be performed. By reading a potential of the bit lines BL with the reading circuit, data can be read from the memory cells of the specified row.

Although the amount of data which can be stored in each of the memory cells 550 is one bit in the above description, the structure of the storage device of this embodiment is not limited to this. The amount of data which is stored in each of the memory cells 550 may be increased by preparing three or more potentials to be supplied to the gate electrode of the transistor 500. For example, in the case where the number of potentials to be supplied to the gate electrode of the transistor 500 is four, data of two bits can be stored in each of the memory cells.

The structures, the methods, and the like described in this embodiment can be combined as appropriate with any of the structures and the methods described in the other embodiments.

Embodiment 5

In this embodiment, application of any of the semiconductor devices described in the above embodiments to an electronic device will be described with reference to FIGS. 10A to 10F. In this embodiment, the case where the semiconductor device described in the above embodiment is applied to an electronic device such as a computer, a mobile phone handset (also referred to as a mobile telephone or a mobile telephone device), a portable information terminal (including a portable game console, an audio player, and the like), a camera such as a digital camera or a digital video camera, an electronic paper, or a television device (also referred to as a television or a television receiver) will be described.

Figure 10A:
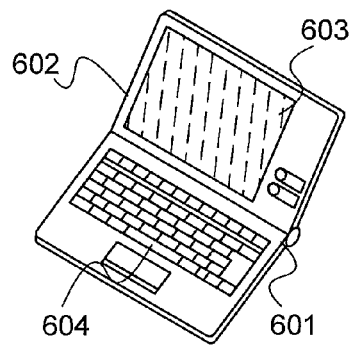
FIGS. 10A to 10F are examples of electronic devices.

FIG. 10A illustrates a laptop personal computer which includes a housing 601, a housing 602, a display portion 603, a keyboard 604, and the like. The miniaturized semiconductor devices described in any of the above embodiments are provided in the housing 601 and the housing 602. Therefore, the laptop personal computer can have characteristics of being small, high-speed operation, and low power consumption.

Figure 10D:
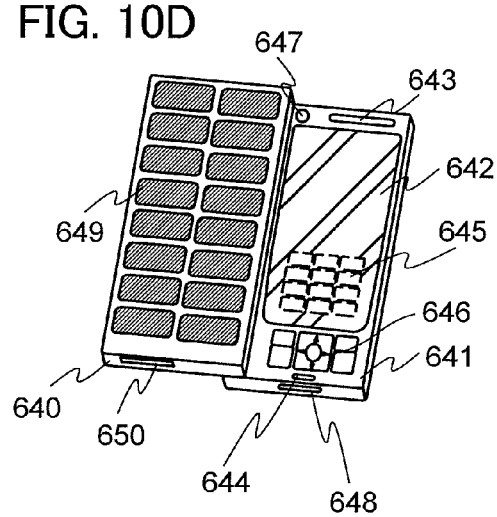
Figure 10B:
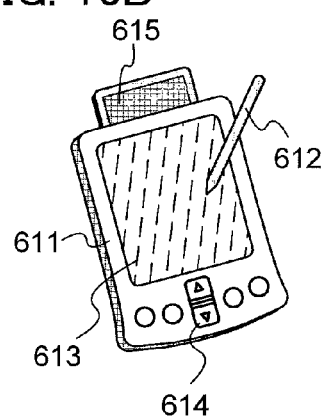

FIG. 10B illustrates a personal digital assistant (PDA) which includes a main body 611 provided with a display portion 613, an external interface 615, operation buttons 614, and the like. In addition, a stylus 612 or the like for operation of the personal digital assistant is provided. The miniaturized semiconductor device described in any of the above embodiments is provided in the main body 611. Therefore, the personal digital assistant can have characteristics of being small, high-speed operation, and low power consumption.

Figure 10E:
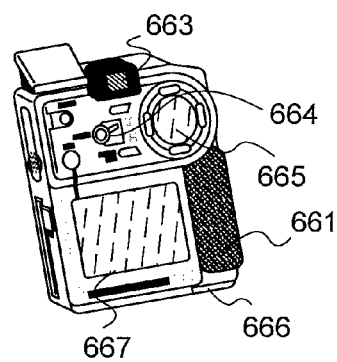
Figure 10C:
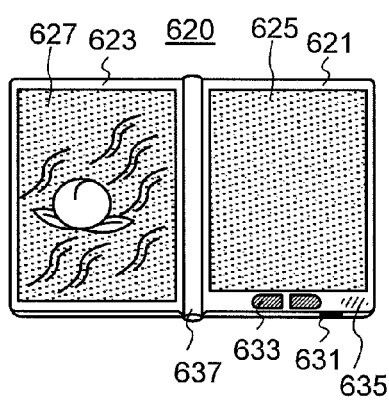

FIG. 10C illustrates an e-book reader 620 including electronic paper. The e-book reader 620 includes two housings, a housing 621 and a housing 623. The housing 621 and the housing 623 are respectively provided with a display portion 625 and a display portion 627. The housing 621 is combined with the housing 623 by a hinge 637, so that the electronic book reader 620 can be opened and closed using the hinge 637 as an axis. The housing 621 is provided with a power button 631, operation keys 633, a speaker 635, and the like. At least one of the housing 621 and the housing 623 is provided with the miniaturized semiconductor device described in any of the above embodiments. Therefore, the electronic book reader can have characteristics of being small, high-speed operation, and low power consumption.

FIG. 10D illustrates a mobile phone handset which includes two housings, a housing 640 and a housing 641. Further, the housings 640 and 641 which are developed as illustrated in FIG. 10D can overlap with each other by sliding; thus, the size of the mobile phone handset can be reduced, which makes the mobile phone handset suitable for being carried. The housing 641 includes a display panel 642, a speaker 643, a microphone 644, a pointing device 646, a camera lens 647, an external connection terminal 648, and the like. The housing 640 includes a solar cell 649 for charging the mobile phone handset, an external memory slot 650, and the like. The display panel 642 has a touch-screen function. A plurality of operation keys 645 which are displayed as images are indicated by dashed lines in FIG. 10D. In addition, an antenna is incorporated in the housing 641. At least one of the housing 640 and the housing 641 is provided with the miniaturized semiconductor device described in any of the above embodiments. Therefore, the mobile phone handset can have characteristics of being small, high-speed operation, and low power consumption.

FIG. 10E illustrates a digital camera which includes a main body 661, a display portion 667, an eyepiece portion 663, an operation switch 664, a display portion 665, a battery 666, and the like. The miniaturized semiconductor device described in any of the above embodiments is provided in the main body 661. Therefore, the digital camera can have characteristics of being small, high-speed operation, and low power consumption.

Figure 10F:
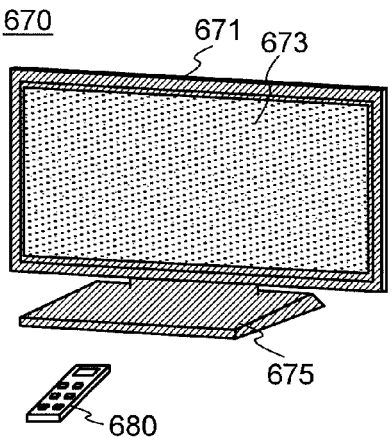

FIG. 10F illustrates a television set 670 which includes a housing 671, a display portion 673, a stand 675, and the like. The television set 670 can be operated with an operation switch of the housing 671 or a remote controller 680. The miniaturized semiconductor device described in any of the above embodiments is provided in the housing 671 and the remote controller 680. Therefore, the television device can have characteristics of being small, high-speed operation, and low power consumption.

Thus, any of the semiconductor devices according to the above embodiments is provided in the electronic devices described in this embodiment. Therefore, the electronic devices can have characteristics of being small, high-speed operation, and low power consumption.

EXPLANATION OF REFERENCE

100: substrate, 102: oxide semiconductor layer, 102a: first crystalline oxide semiconductor layer, 102b: second crystalline oxide semiconductor layer, 104a: source electrode, 104b: drain electrode, 106a: insulating layer, 106b: insulating layer, 108: gate insulating layer, 110: conductive layer, 110a: gate electrode, 110b: conductive layer, 110c: wiring, 112: insulating film, 112a: insulating film, 114a: resist mask, 114b: resist mask, 116: insulating film, 116a: insulating film, 120: conductive layer, 120a: gate electrode, 120b: conductive layer, 120c: wiring, 151: insulating layer, 152: insulating layer, 154: electrode, 156: wiring, 200: transistor, 210: transistor, 220: transistor, 230: transistor, 240: transistor, 250: transistor, 300: transistor, 400: substrate, 406: element isolation insulating layer, 408: gate insulating layer, 410: gate electrode, 416: channel formation region, 420: impurity region, 424: metal compound region, 428: insulating layer, 430: insulating layer, 500: transistor, 510: transistor, 520: capacitor, 550: memory cell, 601: housing, 602: housing, 603: display portion, 604: keyboard, 611: main body, 612: stylus, 613: display portion, 614: operation button, 615: external interface, 620: e-book reader, 621: housing, 623: housing, 625: display portion, 627: display portion, 631: power button, 633: operation key, 635: speaker, 637: hinge, 640: housing, 641: housing, 642: display panel, 643: speaker, 644: microphone, 645: operation key, 646: pointing device, 647: camera lens, 648: external connection terminal, 649: solar cell, 650: external memory slot, 661: main body, 663: eyepiece portion, 664: operation switch, 665: display portion, 666: battery, 667: display portion, 670: television set, 671: housing, 673: display portion, 675: stand, 680: remote controller This application is based on Japanese Patent Application serial no. 2010-171597 filed with the Japan Patent Office on Jul. 30, 2010, the entire contents of which are hereby incorporated by reference.

The invention claimed is:

1. A method for manufacturing a semiconductor device, comprising the steps of:

forming an oxide semiconductor layer on an insulating surface;

forming a source electrode in contact with the oxide semiconductor layer;

forming a drain electrode in contact with the oxide semiconductor layer;

forming a first insulating layer over the source electrode;

forming a second insulating layer over the drain electrode;

after forming the first insulating layer and the second insulating layer, forming a gate insulating layer over the oxide semiconductor layer, the source electrode, the drain electrode, the first insulating layer, and the second insulating layer, wherein the gate insulating layer is in contact with the oxide semiconductor layer between the source electrode and the drain electrode;

forming a conductive layer over the gate insulating layer so that the conductive layer overlaps with at least a part of a region sandwiched between the source electrode and the drain electrode;

forming an insulating film so that the insulating film entirely covers the conductive layer;

processing the insulating film that entirely covers the conductive layer by removing a portion of the insulating film so that at least regions of the conductive layer, which overlap with the source electrode and the drain electrode, are exposed, wherein a highest level of the processed insulating film is not higher than a highest level of the exposed upper surface of the conductive layer; and etching the exposed regions of the conductive layer, thereby forming a gate electrode overlapping with at least the part of the region sandwiched between the source electrode and the drain electrode, wherein a bottom surface of the gate electrode is at a level lower than that of a top surface of the first insulating layer.

2. The method for manufacturing a semiconductor device, according to claim 1, wherein each of the source electrode and the drain electrode is formed to have a tapered portion, wherein the gate electrode is formed to have an inverse tapered portion below an uppermost surface of the gate insulating layer, and wherein only a part of the inverse tapered portion of the gate electrode below the uppermost surface of the gate insulating layer overlaps with a part of the tapered portion of one of the source electrode and the drain electrode.

3. The method for manufacturing a semiconductor device, according to claim 2,
wherein the gate electrode is formed to have a tapered portion over the uppermost surface of the gate insulating layer,
wherein only a part of the tapered portion of the gate electrode over the uppermost surface of the gate insulating layer overlaps with the part of the tapered portion of one of the source electrode and the drain electrode,
wherein the conductive layer includes at least one of aluminum, chromium, copper, tantalum, titanium, molybdenum, and tungsten.

4. The method for manufacturing a semiconductor device, according to claim 1,
wherein the source electrode is in contact with at least a part of a top surface of the oxide semiconductor layer, and
wherein the drain electrode is in contact with at least a part of the top surface of the oxide semiconductor layer.

5. The method for manufacturing a semiconductor device, according to claim 1, wherein the oxide semiconductor layer is in contact with at least a part of a top surface of the source electrode and at least a part of a top surface of the drain electrode.

6. The method for manufacturing a semiconductor device, according to claim 1, wherein a part of the conductive layer, which is left in the etching step, is processed to form a wiring.

7. The method for manufacturing a semiconductor device, according to claim 1, wherein a distance between edges of the source electrode and the drain electrode is greater than or equal to 10 nm and less than or equal to 200 nm.

8. The method for manufacturing a semiconductor device, according to claim 1, wherein the gate electrode is formed by the etching step so that the bottom surface of the gate electrode is at a level lower than that of a bottom surface of the first insulating layer.

9. A method for manufacturing a semiconductor device, comprising the steps of:
forming an oxide semiconductor layer on an insulating surface;
forming a source electrode in contact with the oxide semiconductor layer;
forming a drain electrode in contact with the oxide semiconductor layer;
forming a first insulating layer over the source electrode;
forming a second insulating layer over the drain electrode;
after forming the first insulating layer and the second insulating layer, forming a gate insulating layer over the oxide semiconductor layer, the source electrode, the drain electrode,
the first insulating layer, and the second insulating layer, wherein the gate insulating layer is in contact with the oxide semiconductor layer between the source electrode and the drain electrode;
forming a conductive layer over the gate insulating layer so that the conductive layer overlaps with at least a part of a region sandwiched between the source electrode and the drain electrode;
forming an insulating film so that the insulating film entirely covers the conductive layer;
removing an upper portion of the insulating film to expose at least regions of the conductive layer, which overlap with the source electrode and the drain electrode, are exposed, wherein the exposed upper surface of the conductive layer is flush with an upper surface of the insulating film after removing the upper portion; and
etching the exposed regions of the conductive layer, thereby forming a gate electrode overlapping with at least the part of the region sandwiched between the source electrode and the drain electrode,
wherein a bottom surface of the gate electrode is at a level lower than that of a top surface of the first insulating layer.

10. The method for manufacturing a semiconductor device, according to claim 9,
wherein each of the source electrode and the drain electrode is formed to have a tapered portion,
wherein the gate electrode is formed to have an inverse tapered portion below an uppermost surface of the gate insulating layer, and
wherein only a part of the inverse tapered portion of the gate electrode below the uppermost surface of the gate insulating layer overlaps with a part of the tapered portion of one of the source electrode and the drain electrode.

11. The method for manufacturing a semiconductor device, according to claim 10,
wherein the gate electrode is formed to have a tapered portion over the uppermost surface of the gate insulating layer,
wherein only a part of the tapered portion of the gate electrode over the uppermost surface of the gate insulating layer overlaps with the part of the tapered portion of one of the source electrode and the drain electrode,
wherein the conductive layer includes at least one of aluminum, chromium, copper, tantalum, titanium, molybdenum, and tungsten.

12. The method for manufacturing a semiconductor device, according to claim 9,
wherein the source electrode is in contact with at least a part of a top surface of the oxide semiconductor layer, and
wherein the drain electrode is in contact with at least a part of the top surface of the oxide semiconductor layer.

13. The method for manufacturing a semiconductor device, according to claim 9, wherein a part of the conductive layer, which is left in the etching step, is processed to form a wiring.

14. The method for manufacturing a semiconductor device, according to claim 9, wherein a distance between edges of the source electrode and the drain electrode is greater than or equal to 10 nm and less than or equal to 200 nm.

15. The method for manufacturing a semiconductor device, according to claim 9, wherein the gate electrode is formed by the etching step so that the bottom surface of the gate electrode is at a level lower than that of a bottom surface of the first insulating layer.

16. A method for manufacturing a semiconductor device, comprising the steps of:
forming an oxide semiconductor layer on an insulating surface;
forming a source electrode in contact with the oxide semiconductor layer;
forming a drain electrode in contact with the oxide semiconductor layer;

forming a gate insulating layer over the oxide semiconductor layer, the source electrode, the drain electrode, wherein the gate insulating layer is in contact with the oxide semiconductor layer between the source electrode and the drain electrode;

forming a conductive layer over the gate insulating layer so that the conductive layer overlaps with at least a part of a region sandwiched between the source electrode and the drain electrode;

forming an insulating film so that the insulating film entirely covers the conductive layer;

removing an upper portion of the insulating film to expose at least regions of the conductive layer, which overlap with the source electrode and the drain electrode, are exposed, wherein the exposed upper surface of the conductive layer is flush with an upper surface of the insulating film after removing the upper portion; and etching the exposed regions of the conductive layer, thereby forming a gate electrode overlapping with at least the part of the region sandwiched between the source electrode and the drain electrode.

17. The method for manufacturing a semiconductor device, according to claim 16,
wherein the conductive layer includes at least one of aluminum, chromium, copper, tantalum, titanium, molybdenum, and tungsten.

18. The method for manufacturing a semiconductor device, according to claim 16, wherein a distance between edges of the source electrode and the drain electrode is greater than or equal to 10 nm and less than or equal to 200 nm.

19. The method for manufacturing a semiconductor device, according to claim 16, wherein the upper portion of the insulating film is removed by etching.

20. The method for manufacturing a semiconductor device, according to claim 16, wherein the upper portion of the insulating film is removed by ashing.

21. The method for manufacturing a semiconductor device, according to claim 16, wherein the upper portion of the insulating film is removed by polishing.

* * * * *